US006657130B2

(12) United States Patent
Van Dyke et al.

(10) Patent No.: US 6,657,130 B2
(45) Date of Patent: Dec. 2, 2003

(54) ELECTRICAL AND PHYSICAL DESIGN INTEGRATION METHOD AND APPARATUS FOR PROVIDING INTERCONNECTIONS ON FIRST LEVEL CERAMIC CHIP CARRIER PACKAGES

(75) Inventors: Peter D. Van Dyke, Poughquag, NY (US); Daniel P. O'Connor, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/956,679

(22) Filed: Sep. 20, 2001

(65) Prior Publication Data

US 2003/0051910 A1 Mar. 20, 2003

(51) Int. Cl.[7] ................................................. H05K 1/03
(52) U.S. Cl. ........................ 174/255; 174/264; 361/780; 361/794; 361/795; 29/832; 29/849
(58) Field of Search ................................. 174/255, 262, 174/264, 260; 361/780, 792–795; 29/849, 832

(56) References Cited

U.S. PATENT DOCUMENTS

| | | | | | |
|---|---|---|---|---|---|
| 5,097,593 A | * | 3/1992 | Jones et al. | ................... | 29/852 |
| 5,640,048 A | * | 6/1997 | Selna | .......................... | 257/738 |
| 5,719,750 A | * | 2/1998 | Iwane | ......................... | 361/794 |
| 6,172,305 B1 | * | 1/2001 | Tanahashi | ................... | 174/255 |
| 6,479,758 B1 | * | 11/2002 | Arima et al. | ............... | 174/260 |

* cited by examiner

Primary Examiner—David L. Talbott
Assistant Examiner—Jose H. Alcala
(74) Attorney, Agent, or Firm—Graham S. Jones, II; Ira D. Blecker

(57) ABSTRACT

A multilayer ceramic semiconductor chip carrier is provided by a method of interconnecting ground, signal and power lines in a semiconductor chip carrier. The method involves forming a plurality of insulating layers with conductor lines comprising power and ground lines connected in parallel in a single plane formed in planes between the insulating layers. The parallel lines are directed in orthogonal directions in parallel between any two of the insulating layers with alternation successively between planes of X-directed lines and planes of Y-directed coplanar signal, power and ground lines. There are via connections formed between planes connecting a power line in one plane to another power line in another plane. Other via connections between planes connect a ground line in a first plane to another ground line in a second plane, and signal lines are formed in parallel between a ground line and a power line in a given plane.

20 Claims, 18 Drawing Sheets

GMP

ELECTRICAL AND PHYSICAL DESIGN INTEGRATION METHOD AND APPARATUS FOR PROVIDING INTERCONNECTIONS ON FIRST LEVEL CERAMIC CHIP CARRIER PACKAGES

BACKGROUND OF THE INVENTION

1. Field of the Invention

This invention relates to the field of integrated circuit chip packaging, and more specifically to packaging semiconductor chips on a substrate comprised of multilayer thin and/or thick (e.g. multilayer ceramic or organic) films.

2. Description of Related Art

U.S. Pat. No. 4,866,507 of Jacobs et al. for "Module for Packaging Semiconductor Integrated Circuit Chips on a Base Substrate" describes a structure with alternating insulating and conductive layers formed on a substrate. Some of the conductive layers are patterned to have substantially coplanar spaced apart power/ground lines and signal lines on each layer with interconnections between power/ground lines on different levels forming a power/ground plane at the appropriate voltage level in three dimensions.

SUMMARY OF THE INVENTION

In accordance with this invention a semiconductor carrier and a corresponding method for forming the carrier are provided for interconnecting ground, signal and power lines in a semiconductor carrier. The method of forming the carrier of this invention involves forming a stack of a plurality of insulating layers with generally parallel conductor lines including power lines and ground lines formed in planes therebetween with the generally parallel lines directed in orthogonal directions between any two of the insulating layers with alternation between planes of X-directed lines and planes of Y-directed lines and power lines and ground (reference potential) lines (networks) formed in parallel in a single plane. Form Z-directed via connections between planes connecting a power line in one plane to another power line in another plane. Form Z-directed via connections between planes connecting a ground line in a first plane to another ground line in a second plane, and form a signal line located between a ground line and a power line in a given plane and form a continuing X-directed and/or Y-directed line segment(s) of the signal network (net) in another plane between different ground and power lines.

The signal line and the continuing line segment are connected by one or more Z-directed vias passing through at least one insulating layer.

In another aspect of the invention it is necessary that the signal line and the continuing line segment are connected by a via passing through at least one insulating layer and preferred that the signal line is between a power line and a ground line and the continuing line segment is between another power line and another ground line.

Preferably, a coplanar group of ground, power and signal lines are formed in parallel in a single plane in a surface of one of the insulating layers.

Preferably, the signal line and the continuing line segment are connected by a via passing through at least one insulating layer.

Preferably, the signal line is between a power line and a ground line and the continuing line segment is between another power line and another ground line.

Preferably, a coplanar group of ground, power and signal lines are formed in parallel in a single plane in a surface of one of the insulating layers between a layer of top surface metallurgy (TSM) on top and a layer of bottom surface metallurgy (BSM) on the bottom.

Preferably, there are vias directed along the vertical Z axis interconnecting respective power, ground and signal lines.

The concept of this invention is independent of whether thin or thick multilayers are used, but its actual thick film ceramic hardware embodiment is important for proving the robustness and ease of applicability of the concept, not to overlook the importance of proving the feasibility of applying the idea.

BRIEF DESCRIPTION OF THE DRAWINGS

The foregoing and other aspects and advantages of this invention are explained and described below with reference to the accompanying drawings, in which:

FIG. 1A is a sectional plan view of the prior art multilayer ceramic stack which contains mesh patterned conductive planes and vias looking along the Z axis in a section taken along line 1A–1A' in FIGS. 1B and 1C.

FIG. 1B is a sectional view taken along line 1B–1B' in FIG. 1A.

FIG. 1C is a sectional view taken along line 1C–1C' in FIG. 1A.

FIG. 2A is a sectional plan view of a multilayer ceramic stack which contains mesh patterned conductive planes and vias looking along the Z axis in a section taken along line 2A–2A' in FIGS. 2B and 2C.

FIG. 2B is a sectional view taken along line 2B–2B' in FIG. 2A.

FIG. 2C is a sectional view taken along line 2C–2C' in FIG. 2A.

DESCRIPTION OF THE PREFERRED EMBODIMENT

Figure 1A:
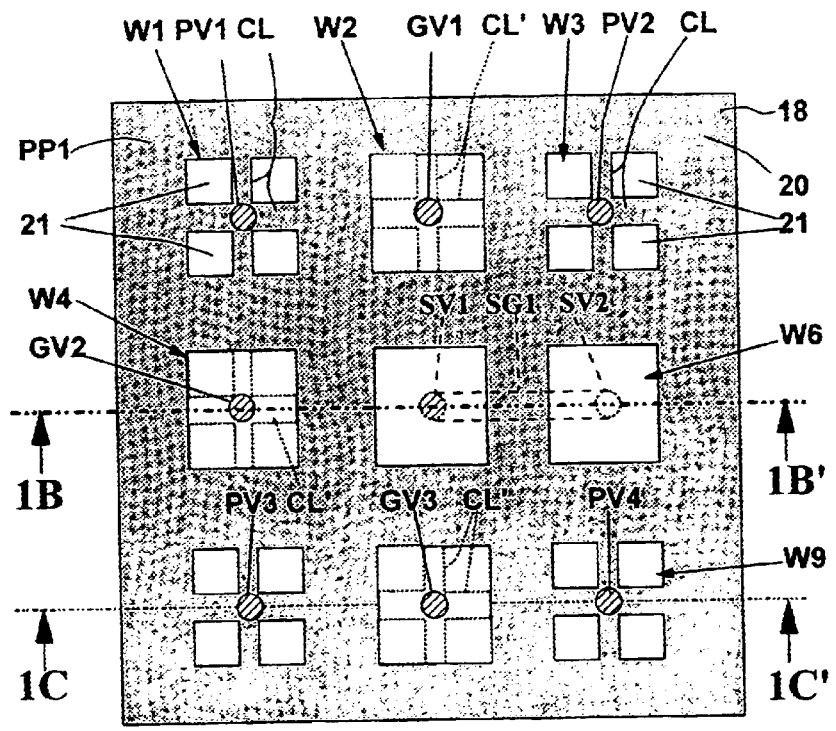
FIGS. 1A–1C show prior art mesh planes in a standard embodiment of a multilayer ceramic chip carrier package.

The integrated circuit chip packaging structure of this invention provides high density physical design for signal C4 (Controlled Collapse Chip Connection, i.e. solder ball) to I/O (Input/Output) wiring, with excellent electrical characteristics and performance, such as low impedance power distribution, ZO impedance matching, relatively low signal line coupled noise, acceptable signal line resistance, excellent signal line shielding and current return paths provided by power and ground bus lines, uniform metal loading per layer, low camber or flatness of thick films, low via bulge, relatively fewer layers, smaller impact on ground rules, manufacturing processes and materials, and ease of physical design technique. In this context, relative means comparison with the STandard Design (STD) method, which results in the usual packaging structures with dedicated explicit power and ground mesh or solid metal structures, each formed in a single plane, to separate the dedicated signal line redistribution layers.

In contrast, this invention uses a coplanar arrangement of power, ground and signal lines on each layer, with no interspersed dedicated, explicit power and ground layers. The thinner the layers are when these coplanar power and ground bus lines are interconnected by short vertical vias (i.e. vias through thin layers), the closer the coplanar power and ground bus lines can approximate explicit mesh planes, and also form an effective three-dimensional power and ground structure. Hence the method of this invention is referred to as the Perfect Vertical Design (PVD), hereinbelow.

The Jacobs et al. U.S. Pat. No. 4,866,507, (cited above) illustrates the problem solved by the present invention. The principal differences between the Jacobs et al. patent and the present invention are that Jacobs et al. addressed the features as follows:

1) strictly multilayer thin films (limited to about five thin film layers) with a solid ground reference plane on a base substrate;
2) a set of peripheral power, ground and signal pin array connections to second level package;
3) directions of coplanar power, ground, and signal lines being preferentially orthogonal to one another and perpendicular to edges of their respective adjacent layers;
4) only "steady state" regions far from the chip connection areas which therefore do not address/solve the problems of power, ground and signal lines escaping from the immediate chip C4 connection area;
5) no successful hardware embodiment realization of the invention concepts. Even at the present time, the yield for their proposed hardware embodiment would be very limited.

In contrast, the present invention can successfully provide the advantageous features as follows:

1) thin and/or thick films with possible use of explicit power or ground (reference) mesh or solid planes when advantageous;
2) ball (e.g. C4 solder ball) or column grid area arrays for connection to a second level package;
3) directions of coplanar power, ground and signal lines being preferentially orthogonal to one another and perpendicular to the edges of their respective layers, and also possibly having layers with 45 degree-lines interspersed between the adjacent orthogonal X and y-line layers;
4) the facility of power, ground, and signal lines escaping from the immediate chip C4 connection area;
5) a functional hardware embodiment of the invention.

In fact, we have already successfully applied the PVD electrical and physical design integration method of this invention to an experimental ten (10) layer ceramic thick film, (32.5 mm×32.5 mm) Single Chip Module (SCM) with an Application Specific Integrated Circuit (ASIC) chip having (648) signal IOs and eight associated decoupling capacitors (decaps).

Electrical and mechanical characteristics and electrical performance parameters of PVD applied to this Single Chip Module have been shown to be better than those of the corresponding STandard Design (STD) method, using explicit power and ground mesh planes which are applied to the same ASIC chip and netlist. The application of PVD to this SCM results in a design solution requiring ten (10) layers, which is two (2) fewer layers than the twelve (12) layers required by the STD method.

DESCRIPTION OF THE PREFERRED EMBODIMENTS

As an introduction to the Perfect Vertical Design (PVD) method and carrier, it is instructive to see how one goes from the traditional STandard Design (STD) method using dedicated signal redistribution layers and explicit power and ground mesh planes to the PVD method and carrier with uniform coplanar signal lines and power and ground bus lines integrated together on each layer.

Figure 1B:
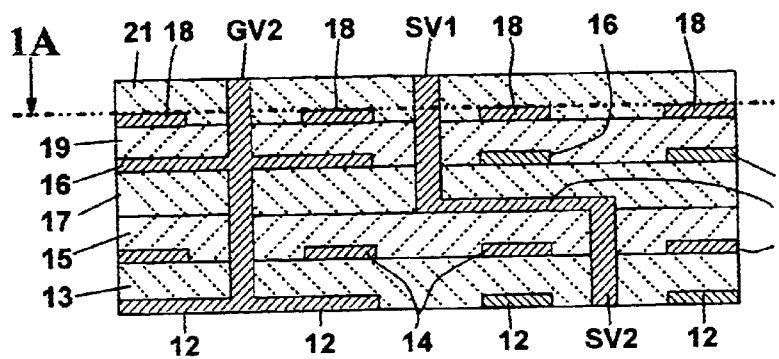
Figure 1C:
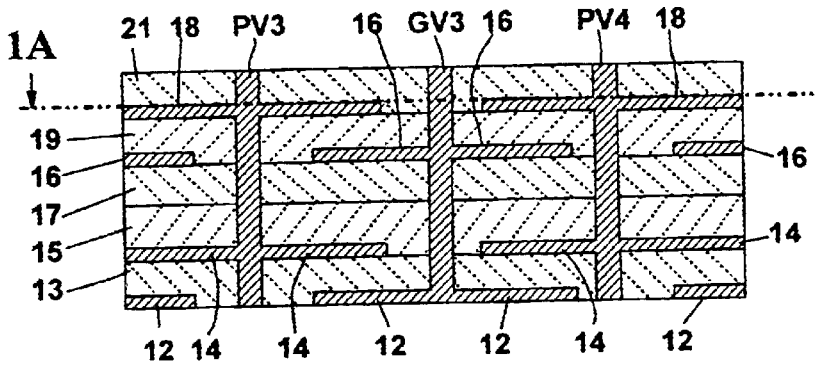

Generically, we can think of the prior art standard mesh planes as being represented by the embodiment shown in FIGS. 1A–1C.

FIG. 1A is a sectional plan view of a prior art multilayer ceramic stack 10 which contains mesh patterned conductive planes and vias looking along the Z axis in a section taken along line 1A–1A' in FIGS. 1B and C which as can be seen in FIGS. 1B and 1C shows a power plane mesh layer 18 at the bottom of a ceramic layer 21.

FIG. 1B is a sectional view taken along line 1B–1B' in FIG. 1A.

FIG. 1C is a sectional view taken along line 1C–1C' in FIG. 1A.

Referring to FIGS. 1A–1C, the prior art stack 10 is formed of a plurality of parallel ceramic layers 13, 15, 17, 19, and 21 which extend horizontally parallel to the X and Y axes in FIG. 1A. The ceramic layers 13, 15, 17, 19, and 21 are stacked one upon the other from the bottom to the top of stack 10, including ceramic layer 13 on the bottom, ceramic layer 15, ceramic layer 17, ceramic layer 19 and ceramic layer 21 on the top. The ceramic layers 13, 15, 19, and 21 include mesh-patterned, conductive planes 12, 14, 16 and 18 for providing electrical ground or electrical power connections and signal net segment SG1 formed in part on the bottom of layer 17, as explained in more detail below.

FIG. 1A shows top views of nine parallel, vertical conductors including four power vias PV1, PV2, PV3, PV4, three ground vias GV1, GV2, GV3, and two signal vias SV1 and SV2 (with signal via SV2 being shown in phantom in that view). Each of the signal vias SV1 and SV2 pass through some of the ceramic layers to provide interconnections to the opposite ends of the signal net segment SG1, which is shown in phantom in FIG. 1A and in section in FIG. 1B, as are the signal vias SV1 and SV2. The other seven vias pass through all of the ceramic layers to provide seven electrical interconnections between the ground planes 12 and 16 or the power planes 14 and 18 respectively.

Each of the mesh-patterned, conductive ground planes 12 and 16 and the power planes 14 and 18 has conductive portions which extend orthogonally, i.e. in both the X and Y directions in the single layer at the bottom of the respective one of the ceramic dielectric layers 13, 15, 19 and 21.

In FIG. 1A, the mesh formed by power plane 18 is connected by connection links CL to the power vias PV1, PV2, PV3, PV4 which are centered in the squares formed by the X and Y stripes of the mesh. Similar connection links CL' are shown in phantom connecting ground planes 12 and 16 to ground vias GV1, GV2 and GV3.

FIG. 1B is a sectional view of the stack 10 taken along line 1B–1B' in FIG. 1A which shows the stack of several dielectric layers 13, 15, 17, 19 and 21 that contain various conductive mesh planes or a signal conductor formed in the lower surfaces thereof and showing the vertically extending ground via GV2 passing through all of the dielectric layers 13, 15, 17, 19 and 21. The combination of the signal via SV1 and signal via SV2 extend in parallel, vertically, from the top to the bottom, of the stack 10 with their connections to signal conductor SG1.

FIG. 1C is a sectional view of the stack 10 taken along line 1C–1C' in FIG. 1A which shows the stack of several dielectric layers 13, 15, 17, 19 and 21 that contain various conductors and showing vertically extending power vias PV3 and PV4 and ground via GV3 extending in parallel, vertically, from the top to the bottom, of the stack 10 passing through all of the ceramic dielectric layers 13, 15, 17, 19 and 21.

Referring to FIGS. 1B and 1C, a first mesh-patterned, conductive, ground plane 12 is formed in the bottom surfaces of the bottom ceramic layer 13. A second mesh-patterned, conductive, ground plane 16 is formed in the bottom surface of the ceramic layer 19.

Referring again to FIGS. 1B and 1C, a mesh-patterned, conductive, power plane 14 is formed in the bottom surface of the ceramic layer 15. A second mesh-patterned, conductive power plane 18 is formed in the bottom surface of the top ceramic layer 21. A linear conductive signal net segment SG1 is formed in the bottom surface of the layer 17.

The three ground vias GV1, GV2, and GV3 connect the ground plane 12 to ground plane 16. FIG. 1B shows the connections to the center left of FIG. 1A, which shows ground via GV2 providing the interconnections between ground plane 12 and ground plane 16 on the left of FIG. 1B.

FIG. 1C shows the connection to the bottom center of FIG. 1A, which shows ground via GV3 which also provide interconnections between ground plane 12 and ground plane 16 in the center of FIG. 1C.

The four power vias PV1, PV2, PV3 and PV4 connect the power plane 14 to power plane 18. Two of the power vias PV3 and PV4 located in the lower left and lower right corners of FIG. 1A provide interconnections between power plane 14 and power plane 18 as seen in FIG. 1C.

The power vias PV1 and PV2 which are located near to the upper left and upper right corners of FIG. 1A pass through the ceramic layers to provide interconnections between the power plane 14 and the power plane 18 in like manner to vias PV3 and PV4.

The signal via SV1 passes through top ceramic layer 21, layer 19 and to the signal net segment SG1 on the bottom of ceramic layer 17 which is directed along parallel to the X-axis to signal via SV2 which passes down through the ceramic layers 15 and 13 to the bottom of the stack 10 for connection to termination points beyond the structure shown which is a fragment of a more complex structure that has been simplified for convenience of explanation and illustration of the prior art.

Referring to FIGS. 1A and 1B, the top level of the stack 10 includes upper power plane mesh 18 at the bottom of the top dielectric layer 21 and above the second dielectric layer 19. The upper ground plane mesh 16 is formed in the bottom of the second dielectric layer 19, as shown in FIGS. 1B and 1C. The lower power plane mesh 14 is formed in the bottom of the fourth dielectric layer 15 of the stack 10. Formed in the bottom dielectric layer 13 of the stack 10 is the ground plane mesh 12.

Power plane mesh 18 comprises a conductive grid layer which extends orthogonally, i.e. in the X and Y directions in a single planar layer pressed into the bottom surface of the top dielectric layer 21 which is preferably formed of a ceramic material through which the various vias PV1–PV4, GV1–GV3 and SV1 extend. The orthogonal power mesh layer 18 is at the same electrical voltage level as the lower power mesh layer 14 because they are interconnected by the power vias PV1–PV4.

Figure 2A:
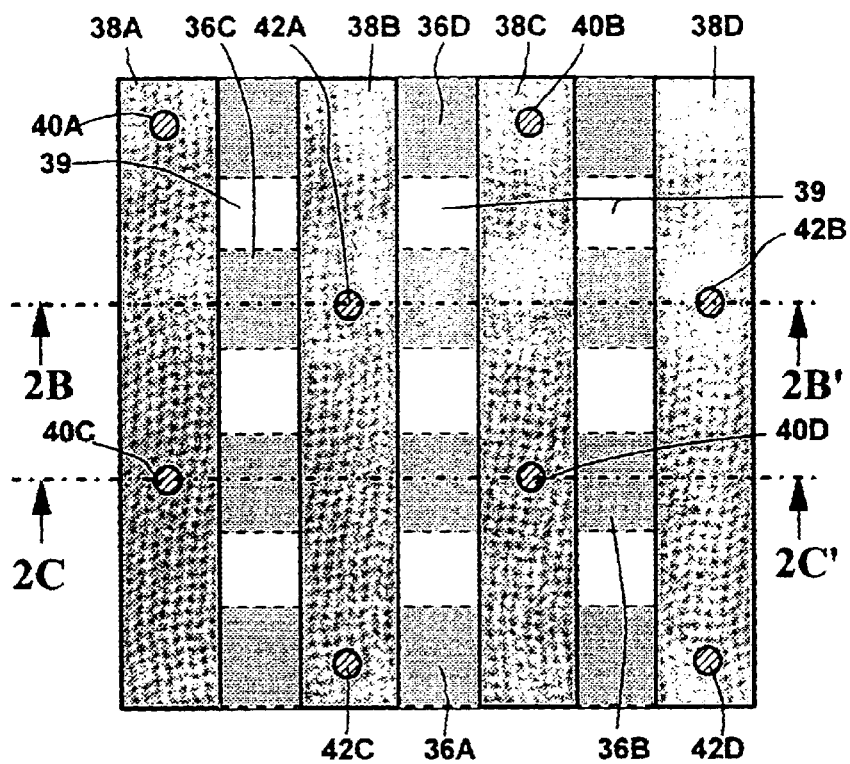
FIGS. 2A–2C are views of an embodiment of the present invention.
Figure 2B:
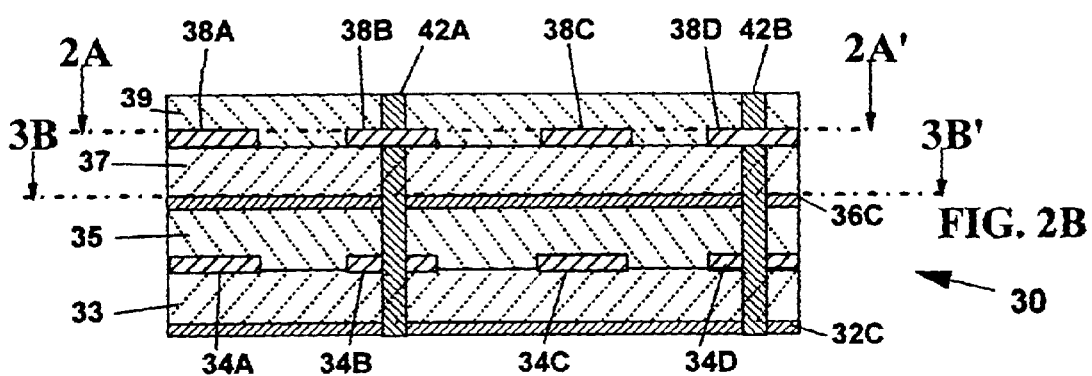
Figure 2C:
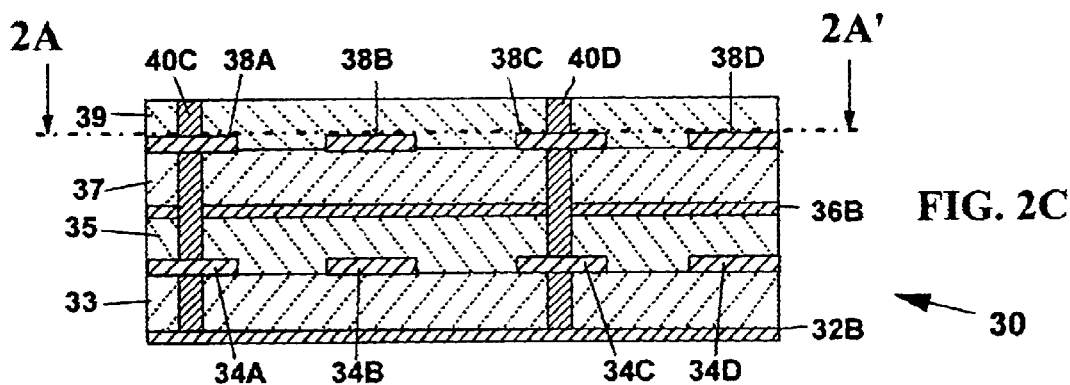

FIGS. 2A–2C are views of an embodiment of the present invention.

FIG. 2A is a sectional plan view of a multilayer ceramic stack 30 which contains coplanar patterned conductive planes and vias looking along the Z axis in a section taken along line 2A–2A' in FIGS. 2B and 2C.

FIG. 2B is a sectional view taken along line 2B–2B' in FIG. 2A.

FIG. 2C is a sectional view taken along line 2C–2C' in FIG. 2A.

In FIG. 2A from the bottom to the top of stack 30 there are four ceramic, dielectric layers 33, 35, 37 and 39 formed on a substrate, not shown for convenience of illustration. There are conductor lines formed in the base of each of the dielectric layers, but in this case the conductor lines (which are alternately power lines and ground lines in a given layer) are all directed in parallel to either the Y axis or in parallel to the X axis in alternate layers with the conductor lines extending in parallel on the bottom of a given dielectric layer.

In FIG. 2A, there are four parallel conductor lines 38A, 38B, 38C and 38D in the base of the upper dielectric layer 39, with those lines extending parallel to the Y axis including two power/voltage lines 38A and 38C alternating with two ground lines 38B and 38D. In the base of the next dielectric layer 37 below the top layer, there are four parallel conductor lines 36A, 36B, 36C and 36D extending parallel to the X axis including two power/voltage lines 36B and 36D alternating with two ground lines 36A and 36C.

The power/voltage lines 36B and 36D are connected to power/voltage lines 38A and 38C by power vias 40A, 40C, 40B and 40D. The ground lines 36A and 36C are connected to ground lines 38B and 38D by ground vias 42A and 42C reaching up to ground line 38B from ground lines 36C and 36A respectively and ground vias 42D and 42B reaching up to ground line 38D from ground lines 36A and 36C respectively. The vias holes parallel to the Z axis are either drilled or punched, and then filled with a conductive material which forms the conductive vias in the final stack 30.

Thus, the original single standard mesh plane has been replaced by two coplanar metal layers with power/voltage lines 38A/38C and ground lines 38B/38D all Y-directed on the first layer and with power/voltage lines 36B/36D and ground mesh lines 36A, 36C all X-directed on the second layer, with the interposed dielectric material of layer 37 which prevents electrical short circuiting. Vertical power/voltage vias 40A, 40B, 40C and 40D and vertical ground vias 42A, 42B, 42C and 42D, which are punched through this dielectric, electrically interconnect the two separate sets of orthogonal voltage and ground mesh or bus lines. If the vertical vias are relatively short compared to the horizontal X axis and Y axis pitch of the voltage and ground bus lines, the orthogonal set of voltage (or ground) bus lines of this PVD structure is essentially electrically equivalent to, but topologically different from the original standard mesh voltage (or ground) plane.

The integrated mesh or bus line PVD carrier in accordance with this invention of FIGS. 2A–2C, forms a complete power distribution system with the usual requirements of low impedance to D.C. and A.C. current flow.

FIG. 2A is a plan view of a stack 30 which is a section taken along line 2A–2A' in FIGS. 2B and 2C of ceramic layers in which conductive circuit patterns are formed and through which vias extend.

FIG. 2B is a sectional view of the stack 30 showing the stack of ceramic dielectric layers 33, 35, 37 and 39 that contain various conductors, as described below showing an array of ground vias 42A, 42B extending in parallel from the top to the bottom of stack 30. The ground vias 42A/42B connect respectively to Y-directed ground stripes 38B/38D at the bottom of ceramic layer 39. Both ground vias 42A, 42B connect to X-directed ground stripe 36C at the bottom of lower ceramic layer 37. The ground vias 42A/42B connect respectively to Y-directed ground stripes 34B/34D at the bottom of the ceramic layer 35. Finally, at the bottom of stack 30 both ground vias 42A, 42B connect to X-directed ground stripe 32C at the bottom of the lowest ceramic layer 33. The limited numbers of the layers 33, 35, 37 and 39, the stripes therein and the vias therein, shown in the X, Y and Z directions are employed for convenience of illustration, as many more layers, stripes and vias are employed in a complete system embodiment, as will be well understood by those skilled in the art.

FIG. 2C is a sectional view of stack 30 taken along line 1C–1C' in FIG. 1A showing the array of power vias 40C and 40D extending in parallel from the top to the bottom of the stack 30. The power vias 40C/40D connect respectively to Y-directed power stripes 38A/38C at the bottom of the top ceramic layer 39. Both power vias 40C/40D connect to X-directed power stripe 36B at the bottom of lower ceramic layer 37. Power vias 40C/40D connect respectively to Y-directed power stripes 34A/34C at the bottom of ceramic layer 35. Finally, at the bottom of stack 30 power vias 40C, 40D both connect to X-directed power stripe 32B at the bottom of the lowest ceramic layer 33.

Figure 3A:
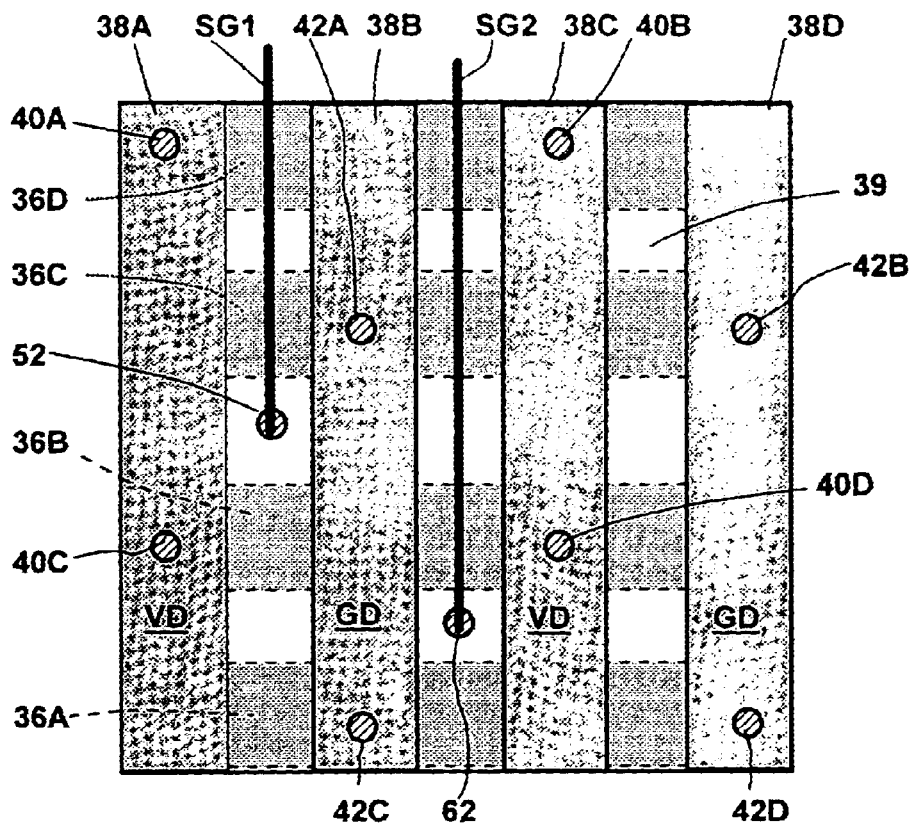
FIG. 3A shows modifications to the sectional view of the stack of FIG. 2A showing signal lines in the PVD carrier of this invention.

FIG. 3A shows a modification to the sectional plan view of stack 30 of FIG. 2A.

Figure 3B:
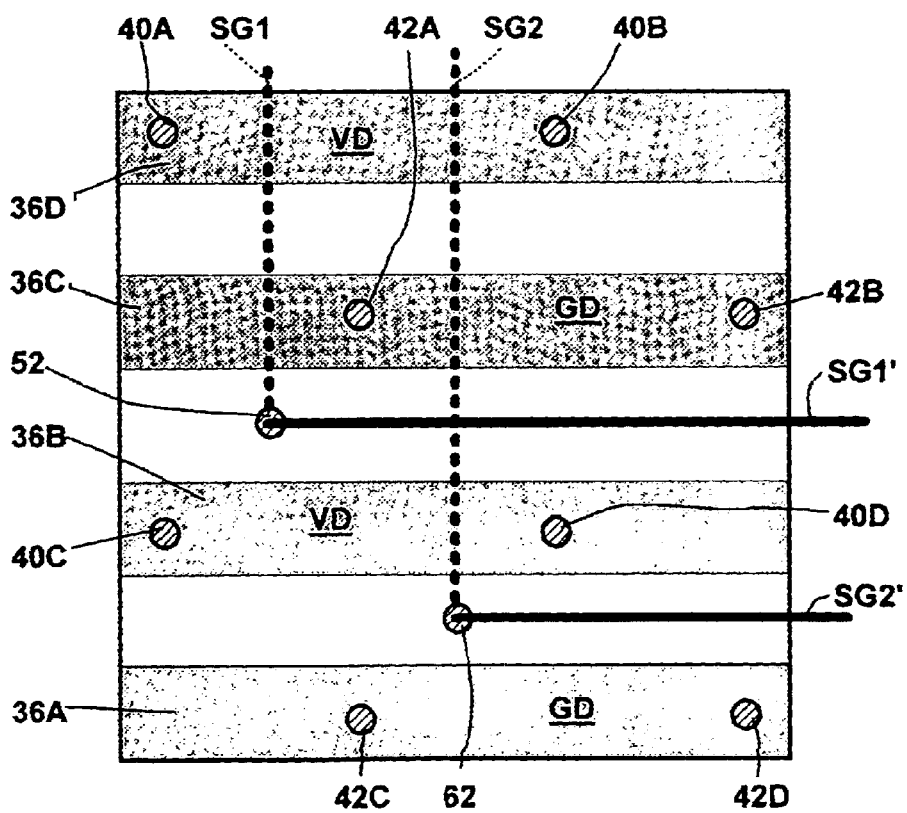
FIG. 3B is a sectional plan view of the stack 30 of FIG. 3A taken along line 3B–3B' in FIG. 2B.

FIG. 3B is a sectional plan view of the stack 30 of FIG. 3A taken along line 3B–3B' in FIG. 2B.

FIGS. 3A and 3B show signal nets SG1/SG1' and SG2/SG2' in the PVD carrier of this invention.

In FIG. 3A the lines comprising signal net segments SG1 and SG2 (of signal nets SG1/SG1' and SG2/SG2') are Y-directed. Signal net segment SG1 is routed between the voltage/power line 38A and the ground bus line 38B where it reaches signal via 52 which extends in the Z direction. Signal net segment SG2 is routed between the voltage/power line 38C and the ground bus line 38B.where it reaches signal via 62 which extends in the Z direction.

In FIG. 3B the lines comprising signal net segments SG1' and SG2' (of signal nets SG1/SG1' and SG2/SG2') are X-directed. Signal nets segment SG1' is routed from the Z directed signal via 52 between the voltage/power line 36B and the ground bus line 36C. Signal net segment SG2' is routed from the Z directed signal via 62 between the voltage/power line 36B and the ground bus line 36A.

In the PVD carrier 30 of FIGS. 3A and 3B there can be signal lines from a given signal net on each layer of this two layer power distribution system, so that one can have an integrated orthogonal system of adjacent sets of signal lines per signal net on multiple layers, with vertical vias interconnecting the signal lines when they change direction and hence their layer. These signal nets have excellent current return paths due to the presence of power and ground bus lines directly on either side thereof. The bus lines also provide electrical shielding of the neighboring lateral signal nets.

The signal nets are electrically decoupled vertically, since they are wired in orthogonal directions or possibly at forty-five degree (45°) directions on adjacent layers. This system of well-defined signal wiring channels allows good impedance control when proper physical constraints are placed on the physical chip package.

Figure 3C:
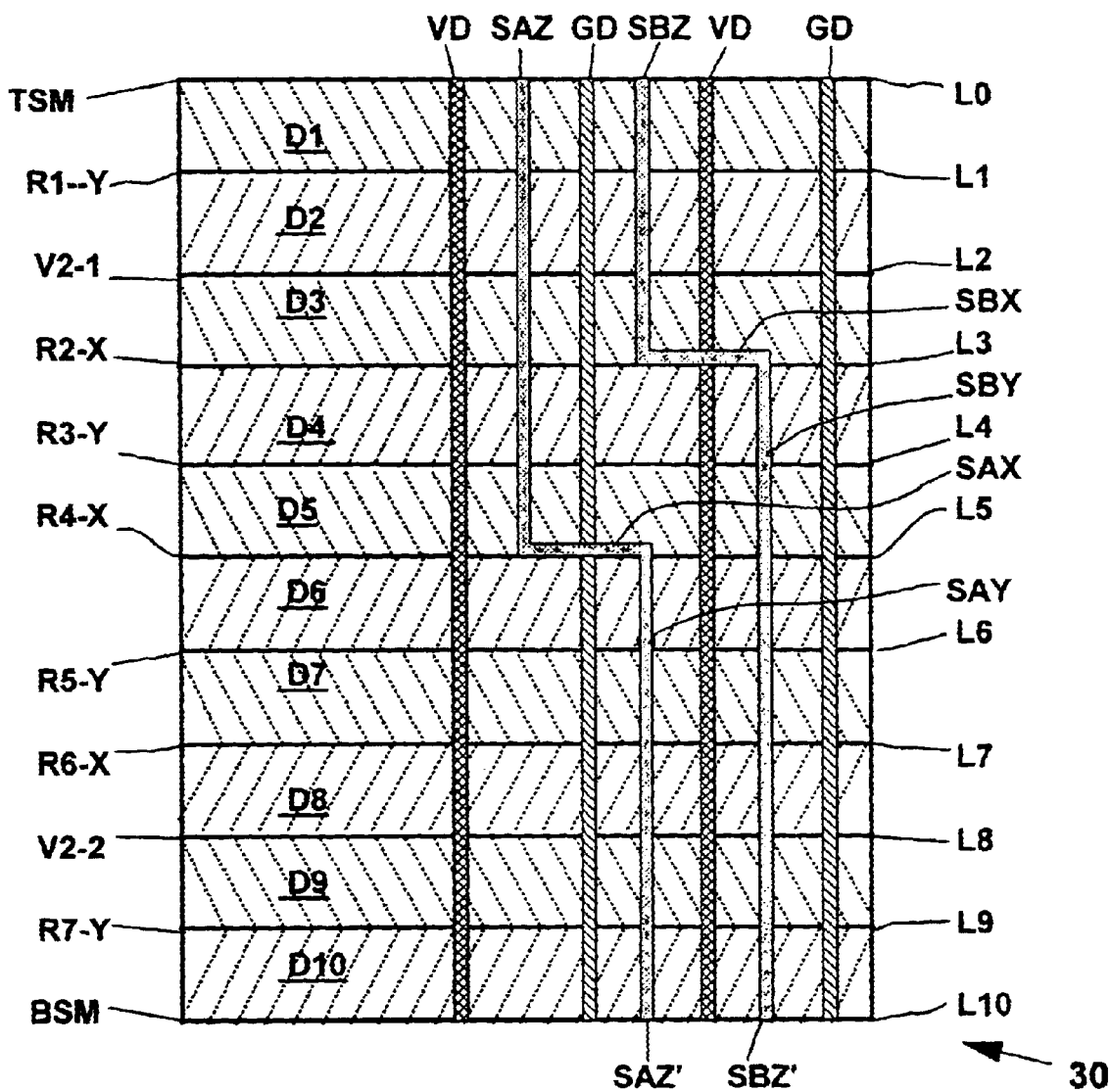
FIG. 3C shows an elevational view of various illustrative via connections and interconnections of signal lines through a thicker more typical embodiment of the carrier of this invention.

FIG. 3C shows an elevational view of various illustrative via connections and interconnections of signal lines through a thicker, more typical, embodiment of the carrier of this invention, with more layers. In particular, FIG. 3C shows various illustrative Z-directed via connections through a thicker more typical embodiment of the carrier 30 which includes the TSM (Top Surface Metallurgy) layer L0, R1Y metallurgy layer L1, V2-1 layer L2, R2-X layer L3, R3-Y layer L4, R4-X layer L5, R5-Y layer L6, R6-X layer L7, V2-2 layer L8, R7-Y layer L9 and Bottom Surface Metallurgy (BSM) layer L10. The V2-1 and V2-2 layers L2 and L8 are explicit power/voltage layers. The R1-Y layer L1, R3-Y layer L4, R5-Y layer L6 and R7-Y layer L9 are redistribution layers with conductor lines extending in the Y-direction. Dielectric (ceramic) layers D1, D2, D3, D4, D5, D6, D7, D8, D9, and D10 are shown which contain the various conductive layers L0 and L1–L10 at the bottom of the dielectric layers D1–D10.

The R2-X layer L3, R4-X layer L5, and R6-X layer L7 are redistribution layers with conductor lines extending in the X-direction. Note that there are voltage via VDA, voltage via VDB (drawn in phantom since it is in another plane than the section of FIG. 3C), ground via GDA (drawn in phantom since it is in another plane than the section of FIG. 3C) and ground via GDB of the type which are described above.

A pair of signal nets SA and SB are shown which are composed of net segments SAZ/SAX/SAZ'/SAY/SAZ" and net segments SBZ/SBX/SBZ'/SBY/SBZ" respectively. Signal nets SA and SB illustrate how the signal vias connect from the top to the bottom and laterally in a multilayer ceramic carrier 30.

Signal via SA is composed of parallel, Z-directed vias SAZ, SAZ' and SAZ" connected by X-directed component SAX on R4-X layer L5, plus a horizontal, Y-directed component SAY on R5-Y layer L5.

Signal via SB is composed of parallel, Z-directed vias SBZ, SBZ' and SBZ" (drawn in phantom since it is also in different plane than the section of FIG. 3C) connected by X-directed component SBX on R2-X layer L3; and a horizontal, Y-directed component SBY on R3-Y layer L4.

Figure 4:
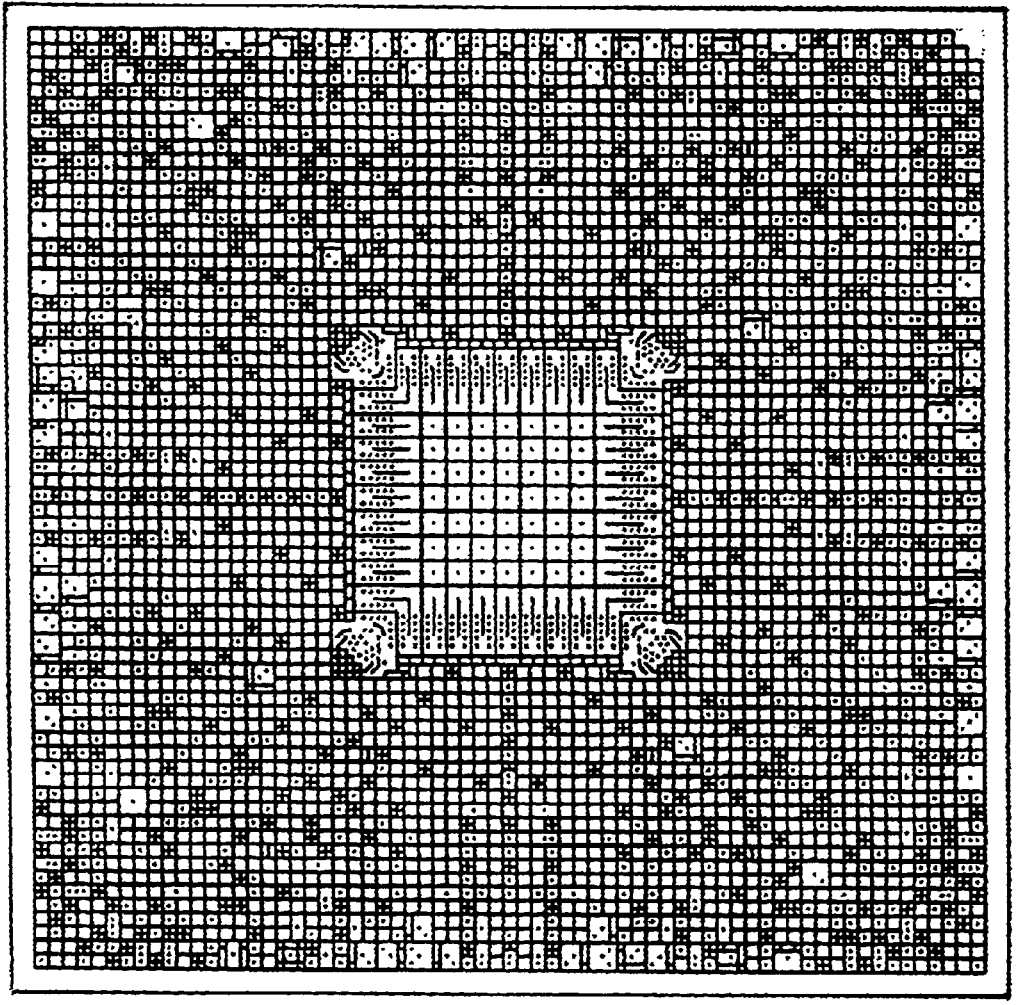
FIG. 4 illustrates how in accordance with the prior art STD method, a typical multilayer layer sequence starts with a dedicated Full Dense Square Hatch (FDSH) ground mesh plane GMP.

FIG. 4 illustrates how in accordance with the prior art STD method, a typical multilayer layer sequence starts with a dedicated Full Dense Square Hatch (FDSH) ground mesh plane GMP.

Figure 5:
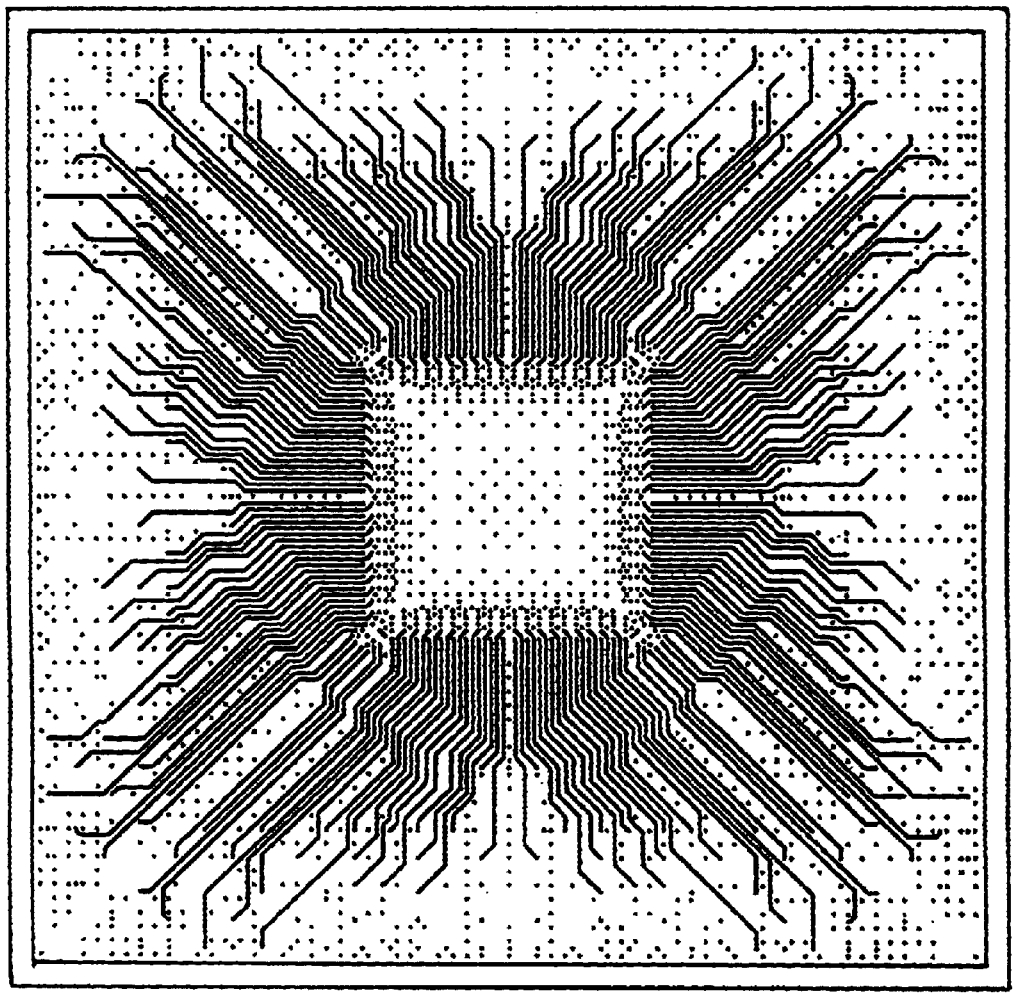
FIG. 5 shows a prior art dedicated Signal Redistribution Plane (SRP).

FIG. 5. shows a prior art dedicated Signal Redistribution Plane (SRP). Note that two consecutive concentric rings of signal C4's are redistributed on this single dedicated signal layer.

Figure 6:
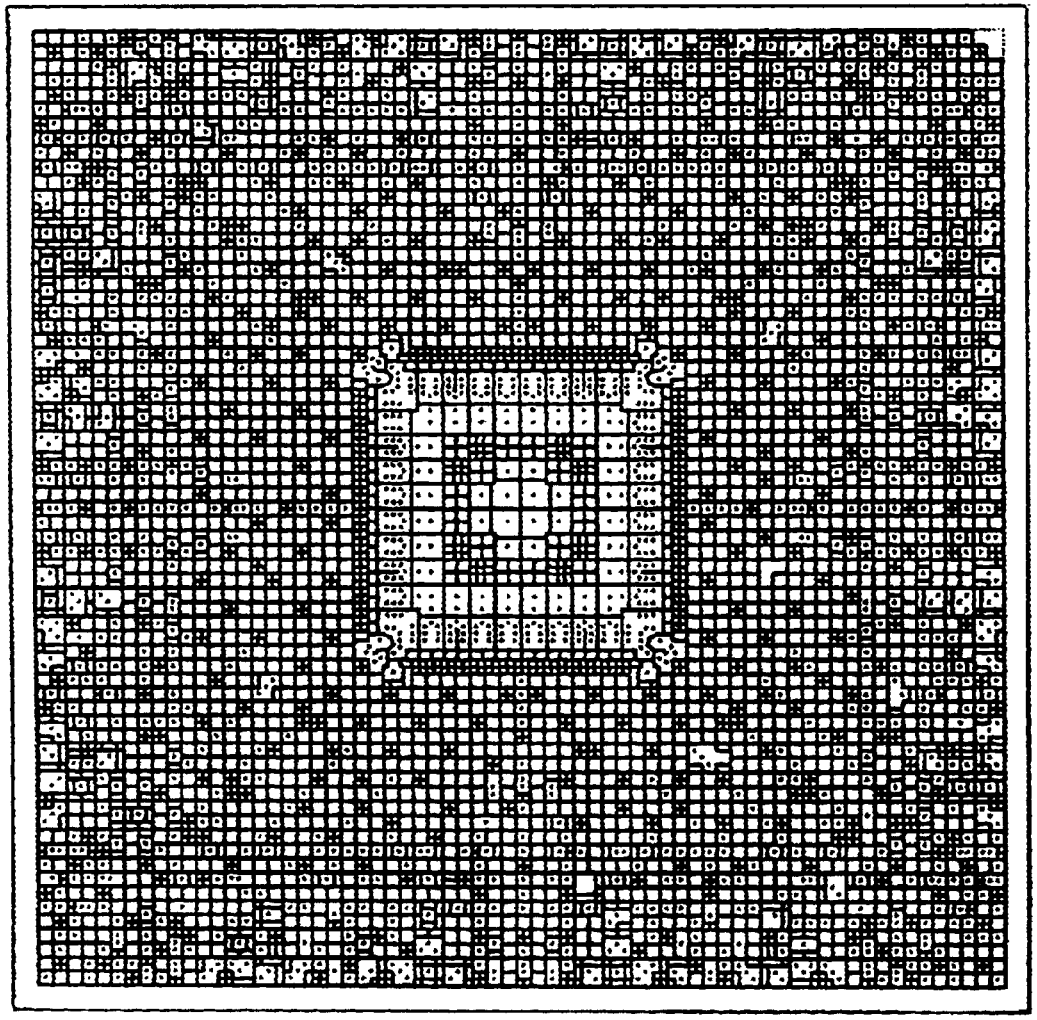
FIG. 6 shows the next layer which is a prior art STD dedicated Full Dense Square Hatch (FDSH) Power Mesh Plane (PMP).
Figure 6:

FIG. 6 shows the next layer which is a prior art STD dedicated Full Dense Square Hatch (FDSH) Power Mesh Plane (PMP). Then another dedicated signal redistribution layer typically follows. Thus it takes basically two layers (a mesh plane and succeeding signal redistribution layer) to redistribute two rings of signal C4's so that they are referenced properly to ground and power mesh structures. Although this has been an acceptable physical and electrical design technique in the past, it is neither electrically as effective nor spatially as efficient as the equivalent PVD method.

In fact, in order to redistribute two rings of signal C4's on the same redistribution layer, as shown by the signal redistribution plane SRP in FIG. 5, the chip power and ground C4 vias must be systematically eliminated as the design proceeds through the multilayered cross-section stack. This will be electrically unacceptable in the near future as switching speeds, signal coupled noise and power distribution noise increase, while voltage transition levels decrease.

The dedicated ground mesh plane GMP of FIG. 4 and the power mesh plane PMP of FIG. 6 of the STD use a large quantity of metal in their outer regions, which do not carry useful ground and power currents to the chip, and also only electrically shield or provide useful current return paths for the relatively few sparse outlying signal lines of the signal redistribution layer. Such Full Dense Square Hatch (FDSH) mesh planes require about forty percent (40%) metal on the lower surface of each layer with usual mesh line thicknesses. Thinner metallic solid ground and power planes are electrically superior, but such a configuration of thin conductors causes significant physical design and manufacturing challenges.

Signal redistribution layers deeper in the cross-section layer stack become very sparse as the concentric rings of signal C4's become peripherally smaller toward the center of the chip. Even the relatively dense signal redistribution plane SRP shown in FIG. 5 has only about twelve percent (12%) metal in contrast to the adjacent ground mesh plane GMP and power mesh plane PMP, each with 40% metal per layer. This non-uniform metal loading of adjacent layers causes excessive package camber, via bulge, and mechanical stress in the thick film layers of the ceramic package.

The PVD structure/method of this invention provides a more systematic and effective physical (mechanical) and electrical design for routing the same two concentric rings of signal C4's in two successive physical layers, and gives better electrical performance as dictated by requirements of the near future. Also, the PVD structure/method of this invention usually produces a module design with two or three fewer layers when decoupling capacitors are required for a chip package.

Referring to FIG. 6, if all the horizontal X-directed power lines are removed and every other vertical (Y) power mesh line is replaced with a vertical Y-directed ground bus line, and with signal line wiring channels inserted between the resulting vertical power and ground bus lines, we obtain the form of signal, power and ground coplanar layer shown in FIG. 11, for the PVD application of this invention described below. Since only one of the concentric rings of signal C4's, from the STD signal redistribution layer shown in FIG. 5, can be redistributed on this coplanar design layer shown in FIG. 11 we need a second such coplanar layer as shown in FIG. 12, to redistribute the 2nd concentric ring of signal C4's from the signal redistribution layer shown in FIG. 5.

This is accomplished in a similar manner as just described. That is, referring to FIG. 4, if all the vertical Y-directed ground lines are removed and every other horizontal X-directed ground mesh line is replaced with a horizontal X-directed power bus line, with signal line wiring channels inserted between the resulting horizontal power and ground bus lines, we obtain the form of signal, power and ground coplanar layer shown in FIG. 12, for the PVD application described later.

Figure 11:
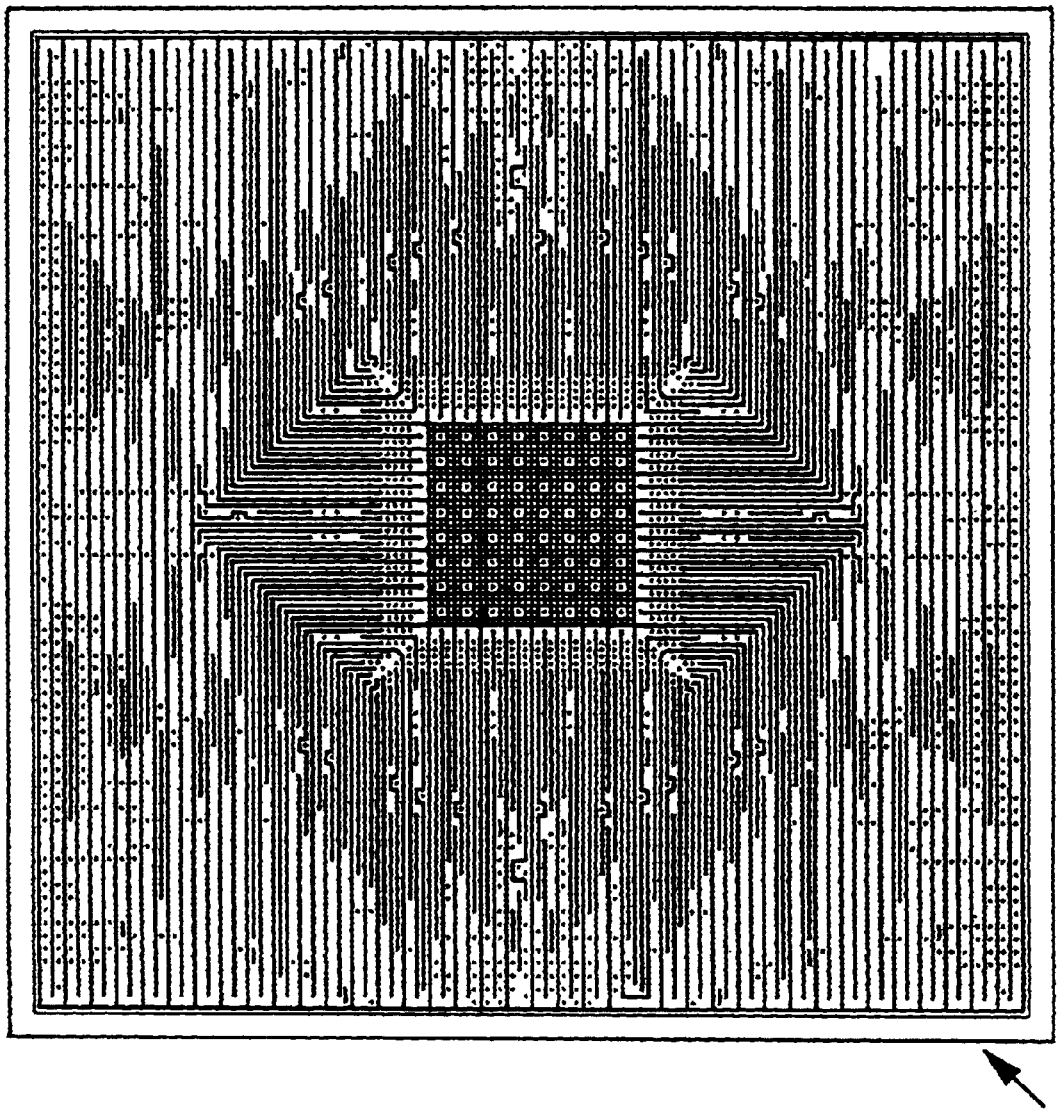
FIG. 11 shows R3-Y layer formed on the bottom of the fourth dielectric layer.
Figure 12:
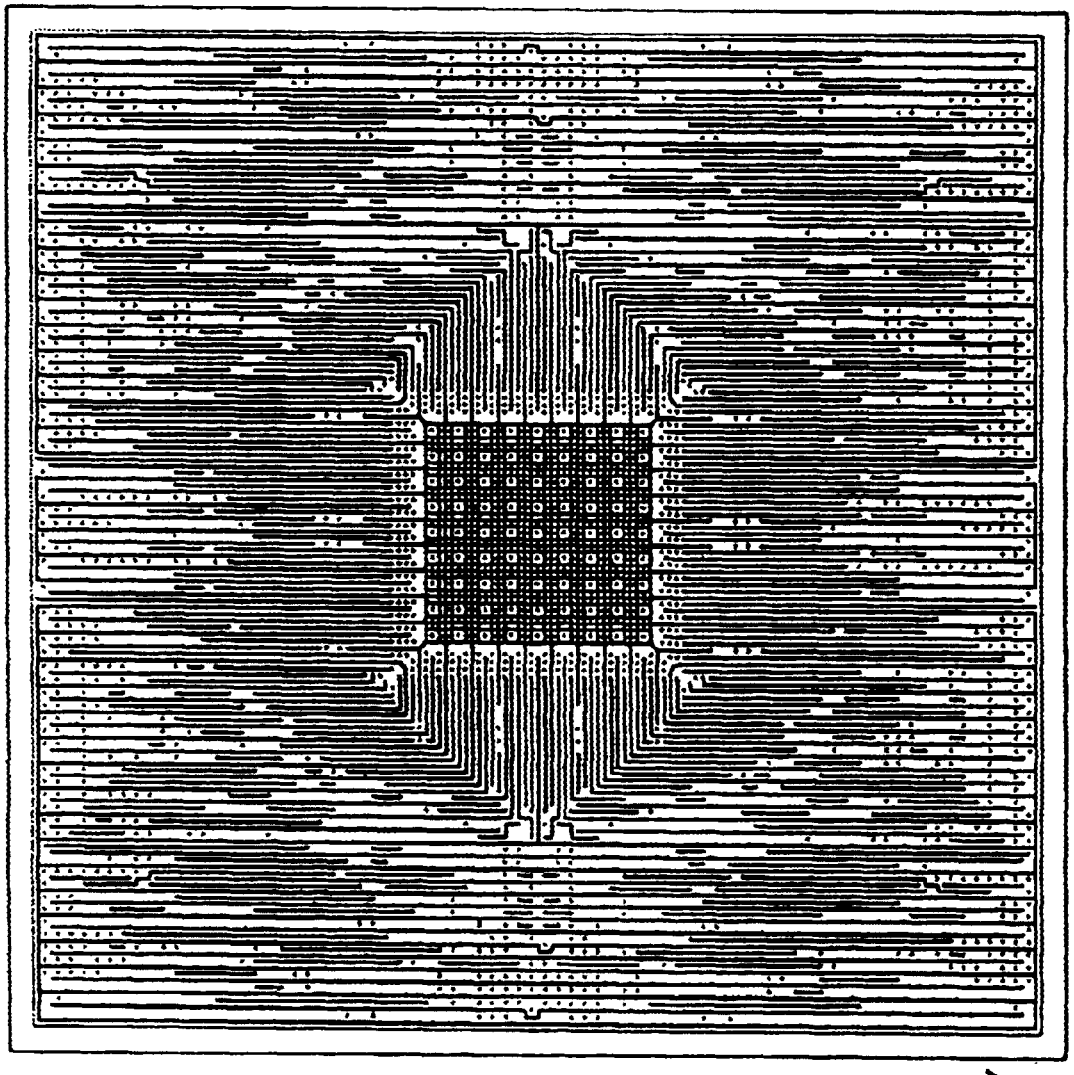
FIG. 12 shows R4-X layer formed on the bottom of the fifth dielectric layer.

The wrong way horizontal X-directed coplanar lines of FIG. 11, and the wrong way vertical Y-directed coplanar lines of FIG. 12, are necessary for the signal, power and ground lines to escape from the sides of the chip which are parallel to the right way direction of coplanar lines on each of these respective layers.

The coplanar power and ground bus lines of these adjacent PVD layers shown in FIG. 11, and FIG. 12 are interconnected by a systematic grid of vertical vias equal in length to the layer thickness. In fact, if the length of these vias is reduced to the shortest possible limit, we obtain a very close approximation to the two Full Dense Square Hatch ground and power planes shown in FIG. 4 and FIG. 6.

Even more advantageously, the present invention provides a true three-dimensional structure for the ground and power distribution system, and the signal redistribution is electrically well integrated with this ground and power distribution system. Hence the name Perfect Vertical Design (PVD) is given to this design method. Each of the signal lines sees the same excellent power and ground return path on either side, and it is also shielded from other neighboring signal lines on either side.

Since the signal lines on FIG. 11, are for the most part (except for shorter segments of wrong way lines) orthogonal to the sets of signal lines on adjacent layers above and below shown in FIG. 10 and FIG. 12, they also are electrically decoupled from the vertically adjacent signal line sets on these adjacent coplanar layers. Metal loading is uniform for all layers at about 25% to 30% metal per layer. This uniform metal loading and orthogonal wiring throughout the package layers promotes lower package camber and thus lower via bulge, and also low mechanical stress and thus higher reliability for the entire package.

This invention provides a multilayer thin and/or thick film PVDesign carrier made by the method of this invention which has been applied successfully to a ten (10) layer ceramic substrate with six hundred forty-eight (648) signal IOs on the chip and eight (8) decoupling capacitors (decaps) on its Top Surface Metallurgy (TSM). Rather than explain in detail the well known state of the art thick film ceramic substrate manufacturing processes which are used to produce this Single Chip Module (SCM), emphasis will be put on describing the PVD physical design technique used to generate the masks which are used to pattern the via holes and lines on each ceramic layer. The eleven (11) design plots shown in FIGS. 7 to 17, which illustrate a top view of these patterns on the TSM and following bottom sides of the ten (10) ceramic layers comprising this module, will be used to help explain the design concepts associated with this invention.

Figure 7:
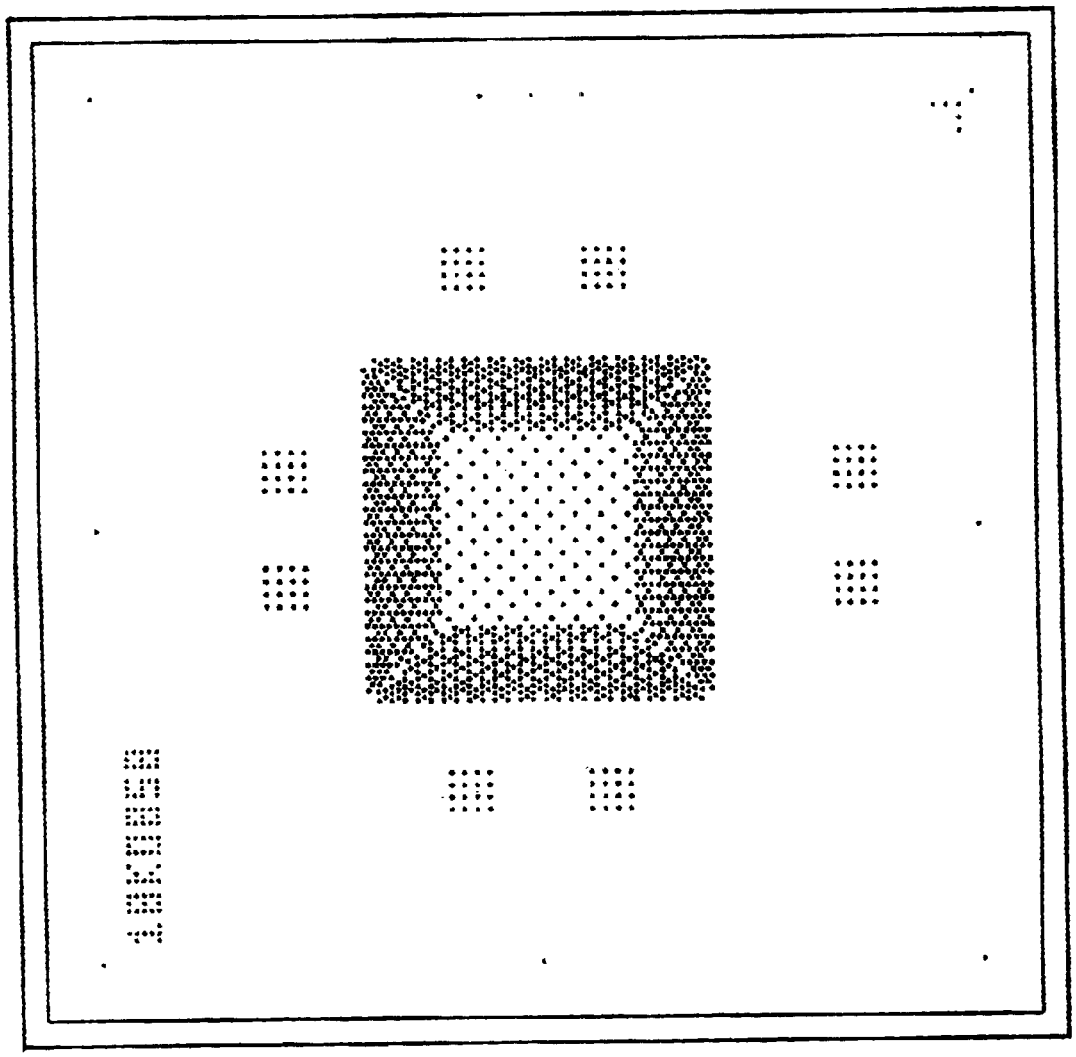
FIG. 7 shows the Top Surface Metallurgy (TSM) layer which is formed on the top of the top ceramic layer of FIG. 3C, although it is not shown in FIG. 3C.

FIG. 7 shows the Top Surface Metallurgy (TSM) layer L0 formed on the top of the first ceramic layer D1 of FIG. 3C (above L1). The center array of chip C4's consist of signal C4's, five different voltage level C4's, ground reference C4's and some unused dummy C4's. Eight decoupling capacitors surround the chip and have C4's for the five voltage levels and ground reference for the decoupling capacitors (decaps). All the chip and decoupling capacitor (decap) C4's are connected to the bottom of this first layer by vertical vias punched through the layer.

Figure 8:
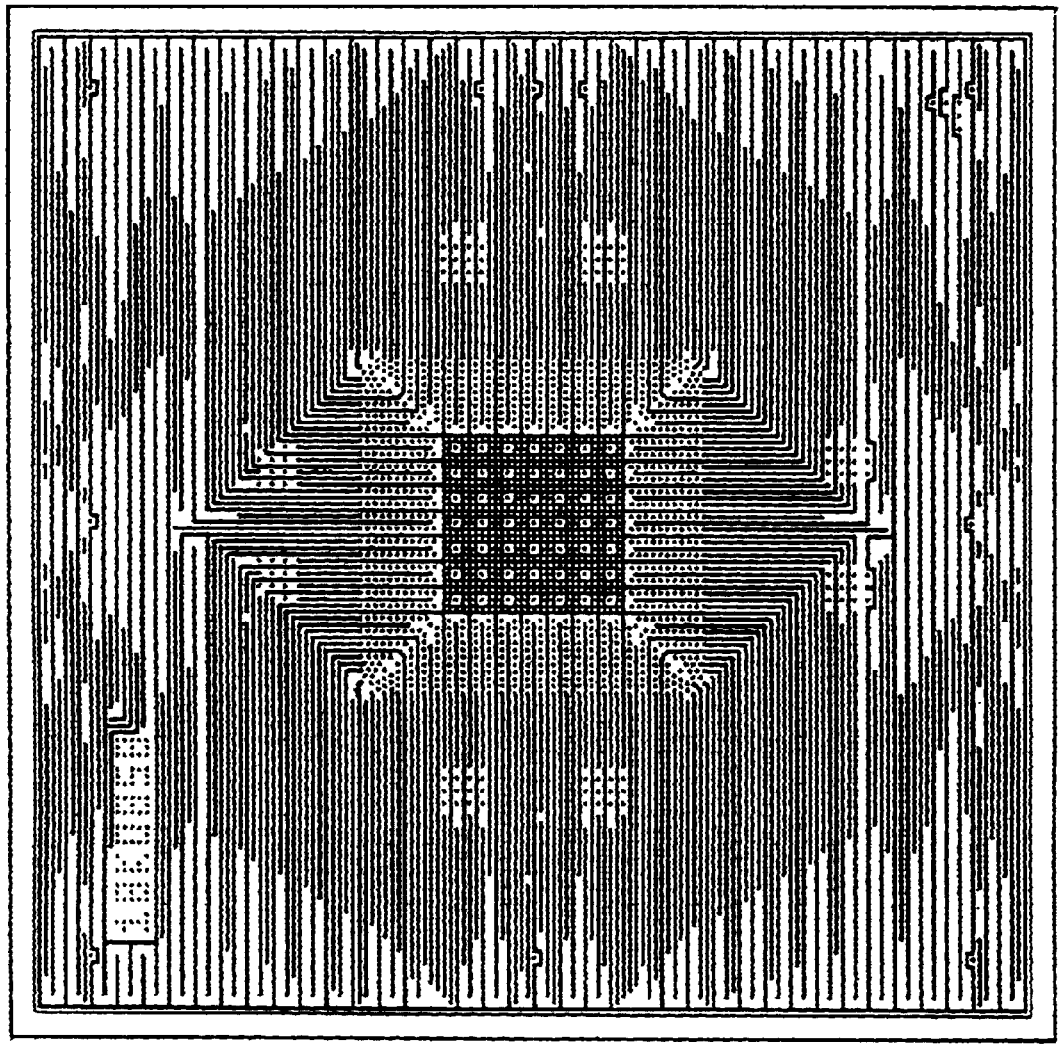
FIG. 8 shows the R-1Y layer also referred to as the Bottom of Top Surface Metallurgy (BTSM) formed on the bottom of this first ceramic dielectric layer.

FIG. 8 is an illustration of R-1Y layer L1 also referred to as the Bottom of Top Surface Metallurgy (BTSM), which is formed on the bottom of the first ceramic layer D1. The BTSM layer L1 has a predominantly vertical Y-direction of coplanar signal, power and ground lines. The minority of horizontal X-directed "wrong-way" lines are required so that signal, power and ground C4's on the left and right sides of the chip can escape. Signal vias and lines are between grey ground reference vias and lines and black voltage VD1 vias and lines.

Figure 9:
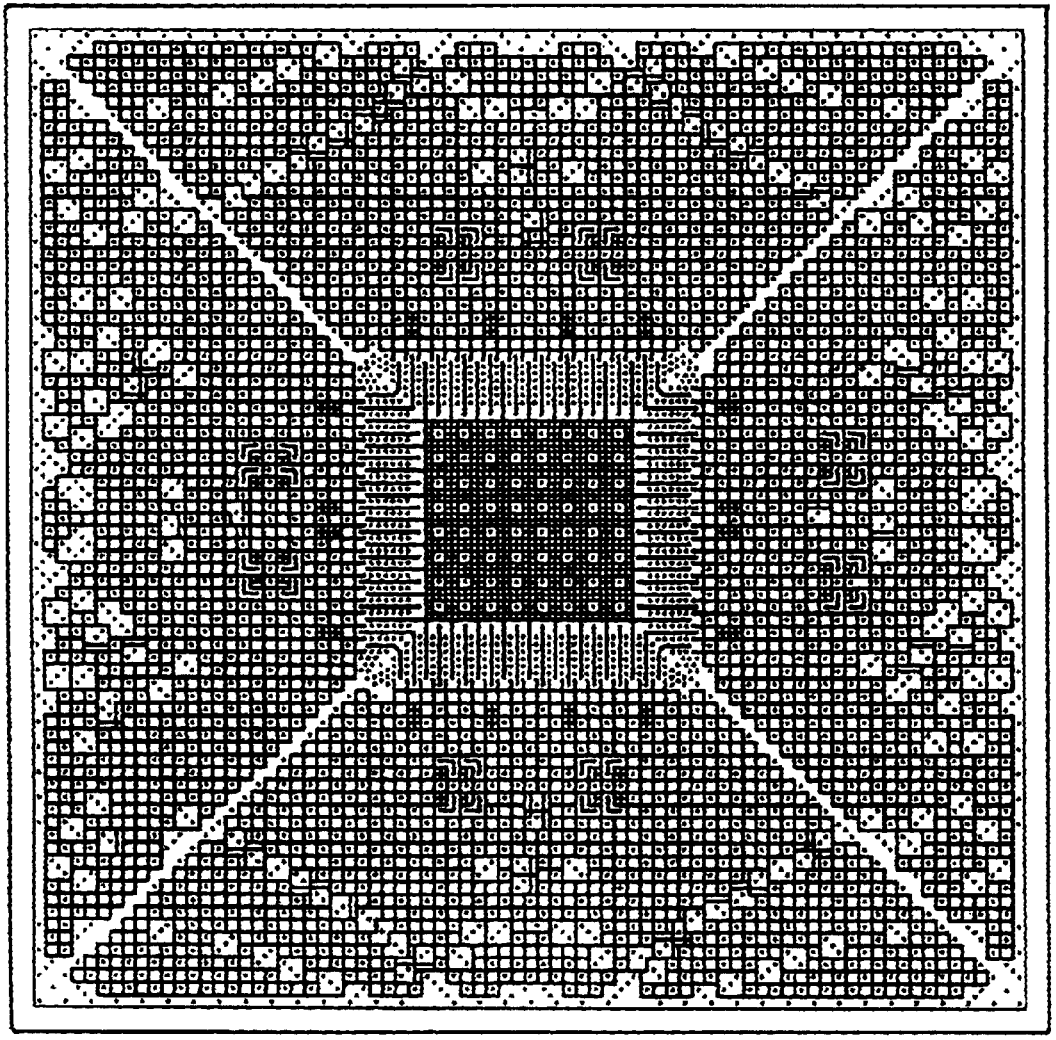
FIG. 9 shows the V2-1 layer formed on the bottom of the second ceramic, dielectric layer which interconnects many of the chip C4 voltage vias dropping from the TSM layer of FIG. 7.

The vias and lines for the other voltages VDX, X=2, 3, 4 and 5, respectively, are represented more clearly by the four (4) large triangular mesh segments seen in layer 2 of FIG. 9. The center ground reference mesh of layer L1 (FIG. 8) interconnects many of the chip C4 ground reference vias dropping from the TSM layer L0 (FIG. 7), and serves as a source for the ground reference bus lines of BTSM (R1-Y) layer L1, which interconnect the rest of the TSM chip C4 ground reference vias dropping from the TSM layer L0.

Similarly, FIG. 9 shows the center voltage VD1 mesh of V2-1 layer L2 (formed on the bottom of the second ceramic, dielectric layer D2) interconnects many of the chip C4 voltage VD1 vias dropping from the TSM layer L0 (FIG. 7).

Figure 10:
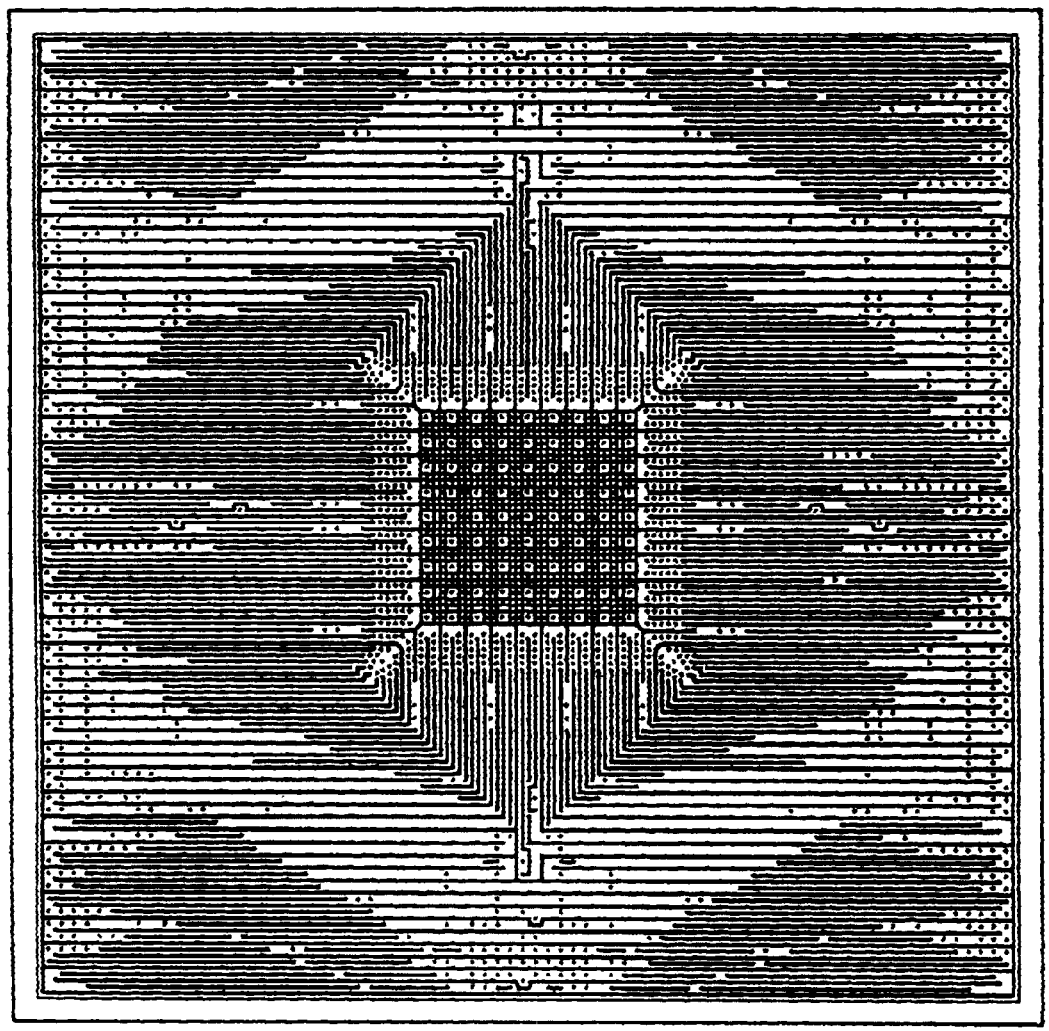
FIG. 10 shows the R2-X layer formed on the bottom of the third dielectric layer.
Figure 10:

FIG. 10 shows R2-X layer L3 which is formed on the bottom of the third dielectric layer D3.

FIG. 11 shows R3-Y layer L4 which is formed on the bottom of the fourth dielectric layer D4.

Most of the chip C4 power supply and ground return currents are supplied by the power and ground vias under the chip, and the small central meshes in the center of the various module layers. The R2-X layer L3 of FIG. 10 and the R3-Y layer L4 of FIG. 11 clearly show these features, and illustrate how the VD1 power and GND ground bus lines are energized and emanate from these central meshes. These bus lines shield and provide current return paths for the signal lines, which are routed from their source chip C4's to their sink module IO's on the Bottom Surface Metallurgy (BSM).

Each signal line has a power VD1 bus line on one side and ground GND bus line on the other side. It should be clear that this is a very efficient way of integrating the physical and electrical design of a chip package without requiring any new manufacturing processes, materials or stressing normal MLC ground rules. It has been shown by calculations and measurements that PVD very often will reduce physical layers, improve electrical performance, and simplify the manufacturing of first level chip packages, relative to other design methods such as STD.

The orthogonal sets of power VD1 and ground GND bus lines on adjacent layers are systematically interconnected by vertical vias, and the shorter these vias(i.e. the thinner the layers), the more closely these orthogonal sets of power and ground bus lines approximate explicit Full Dense Square Hatch (FDSH) power and ground mesh planes. Yet the signal redistribution can also be done on the same layer as these power or ground bus lines, which provide the power and ground distribution system and also shield and provide current return paths for the signal nets.

The decoupling capacitors are connected to the various power and ground bus lines and thus to the small central mesh planes on layers L1, L2 and L3, in order to shorten the power and ground current distribution paths for the TSM chip C4's. The decoupling capacitor (decap) connections are transparent to the PVD method when the pattern and pitch of the decoupling capacitor (decap) C4's are similar to that of the chip C4's. This is another example of where a more robust design method has removed arbitrariness (of the decoupling capacitor (decap) C4 configuration) from the design problem for specific and correct reasons. The STD requires two extra mesh plane layers to connect these decoupling capacitors (decaps).

In FIG. 9 the more conventional power distribution for the other voltage levels VD2, VD3, VD4 and VD5, is shown by the five-way segmented FDSH mesh plane, where the small center mesh for VD1 helps interconnect the chip VD1 C4's to their center meshes and coplanar VD1 bus lines on the integrated coplanar signal, power and ground layers.

If the pattern of chip C4's for VD2, VD3, VD4, and VD5 had been arranged in dedicated columns similar to the GND and VD1 C4's and had been quadrant flip symmetric about the X and Y axes, rather than triangular and rotationally symmetric about the origin, as in this particular design, then these other four voltage levels could also have been distributed by coplanar bus lines with no explicit mesh planes being used in the entire chip package design. Then the PVDesign of this Single Chip Module (SCM) would have required only eight (8) instead of ten (10) layers, in contrast to the twelve (12) layers required by STD for the same SCM.

However, with this pattern and associated rotational symmetry, it was more effective to use two conventional mesh planes for these VD2, VD3, VD4, VD5 voltage levels on layers L2 and L8. The VD2, VD3, VD4, and VD5 chip C4's, their two FDSH mesh planes and corresponding BSM balls are interconnected by strategically placed vertical vias to enhance their power distribution. Thus PVD can be used with the STandard Design(STD) method to produce a hybrid design, which includes mesh planes where necessary.

As shown in FIG. 10, layer L3 has a predominant horizontal direction for the coplanar signal, VD1 and GND lines. The small center ground mesh is the main source for the ground GND bus lines on this layer.

FIG. 12 shows R4-X layer L5 which is formed on the bottom of the fifth dielectric layer D5.

Figure 13:
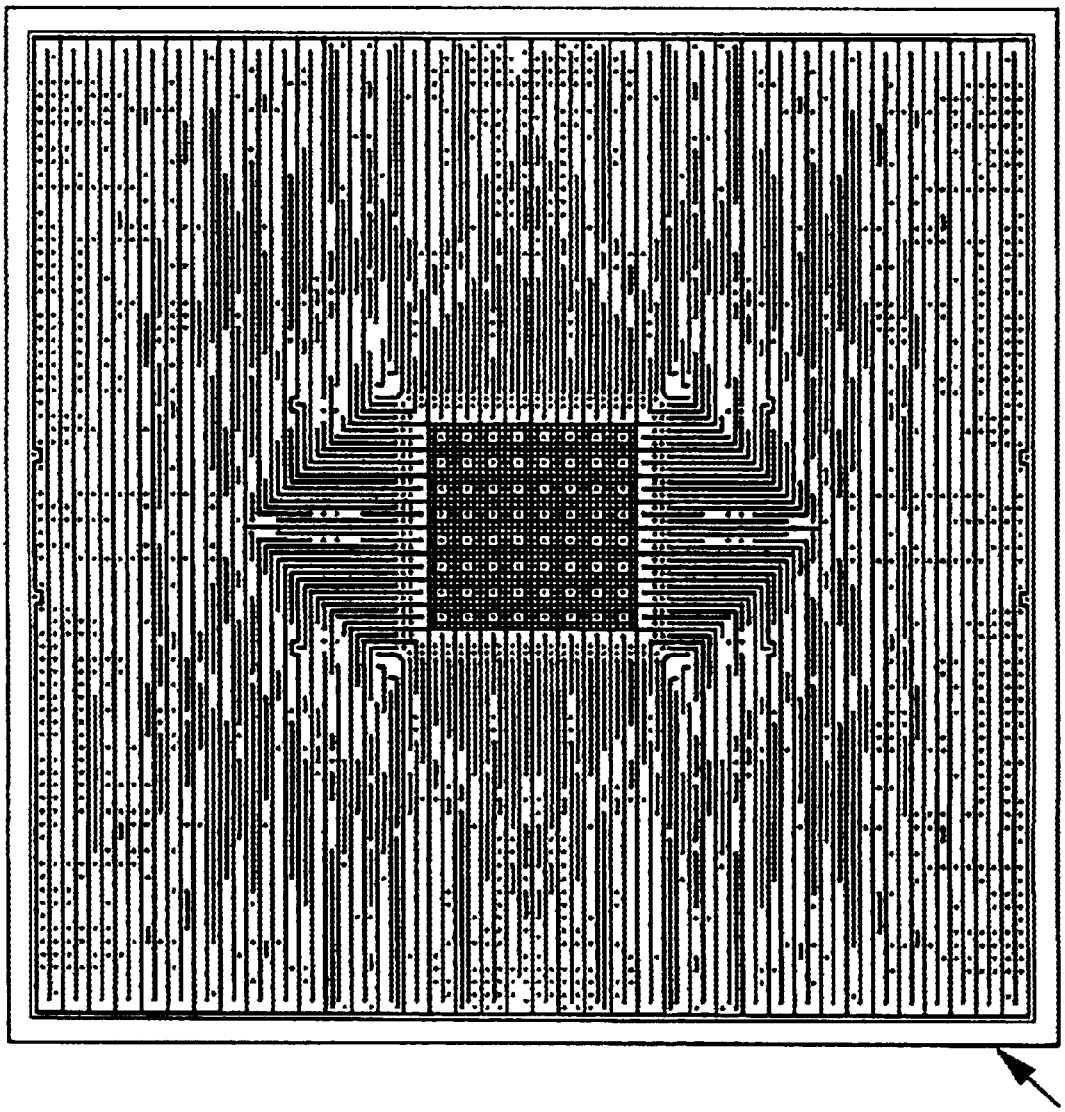
FIG. 13 shows R5-Y layer formed on the bottom of the sixth dielectric layer.

FIG. 13 shows R5-Y layer L6 which is formed on the bottom of the sixth dielectric layer D6.

Figure 14:
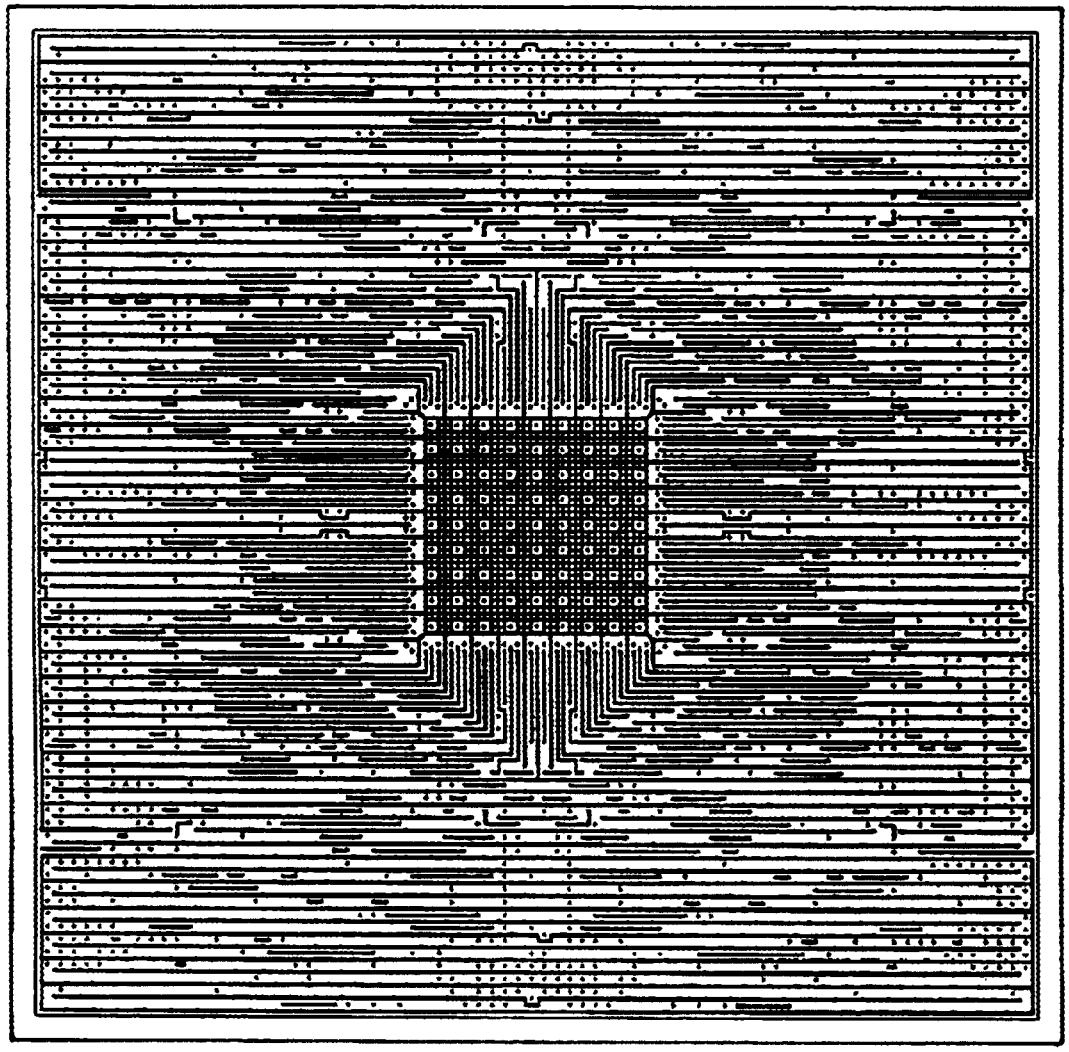
FIG. 14 shows R6-X layer formed on the bottom of the seventh dielectric layer.

FIG. 14 shows R6-X layer L7 which is formed on the bottom of the seventh dielectric layer D7.

Figure 15:
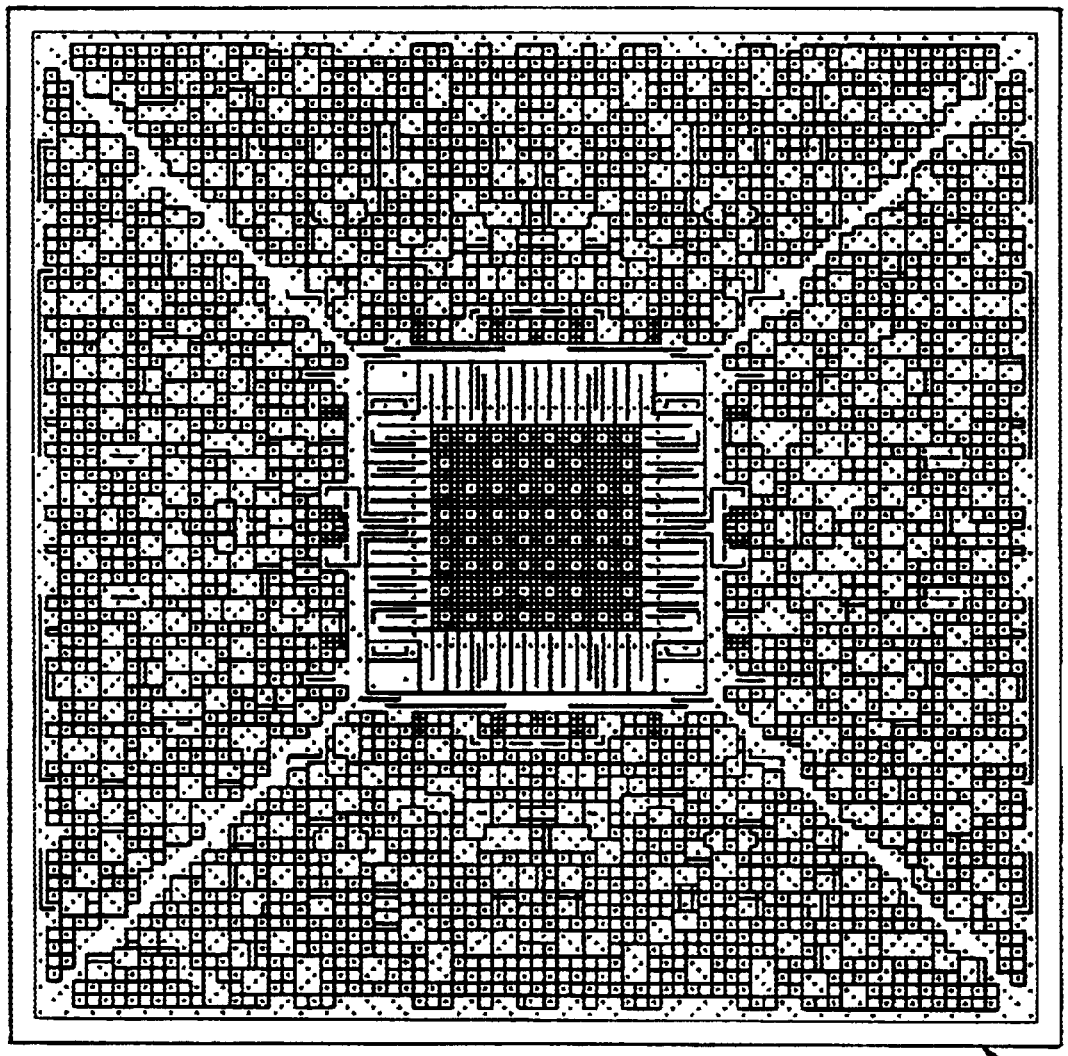
FIG. 15 shows V2-2 layer formed on the bottom of the eighth dielectric layer.

FIG. 15 shows V2-2 layer L8 which is formed on the bottom of the eighth dielectric layer D8.

Figure 16:
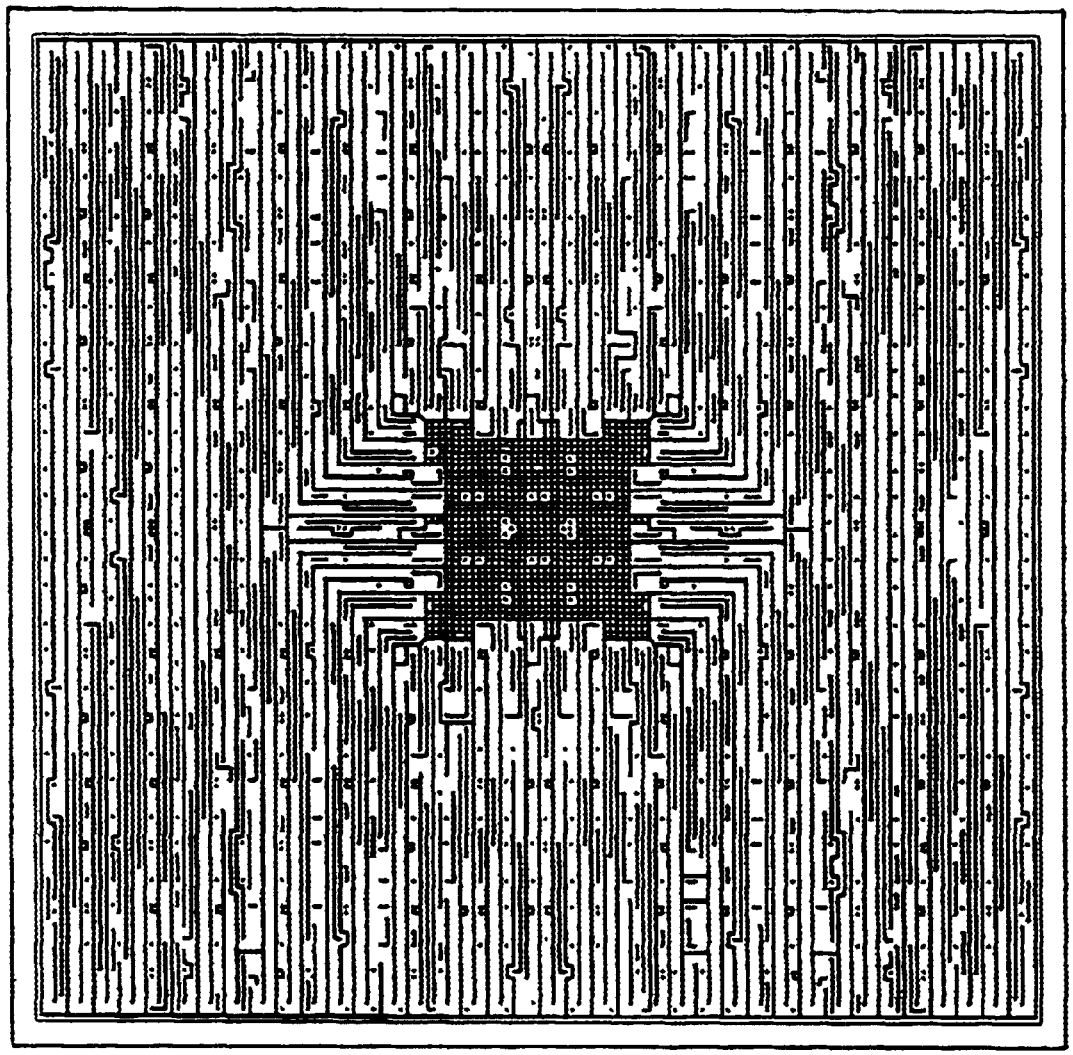
FIG. 16 shows R7-Y layer formed on the bottom of the ninth dielectric layer.

FIG. 16 shows R7-Y layer L9 which is formed on the bottom of the ninth dielectric layer D9.

Figure 17:
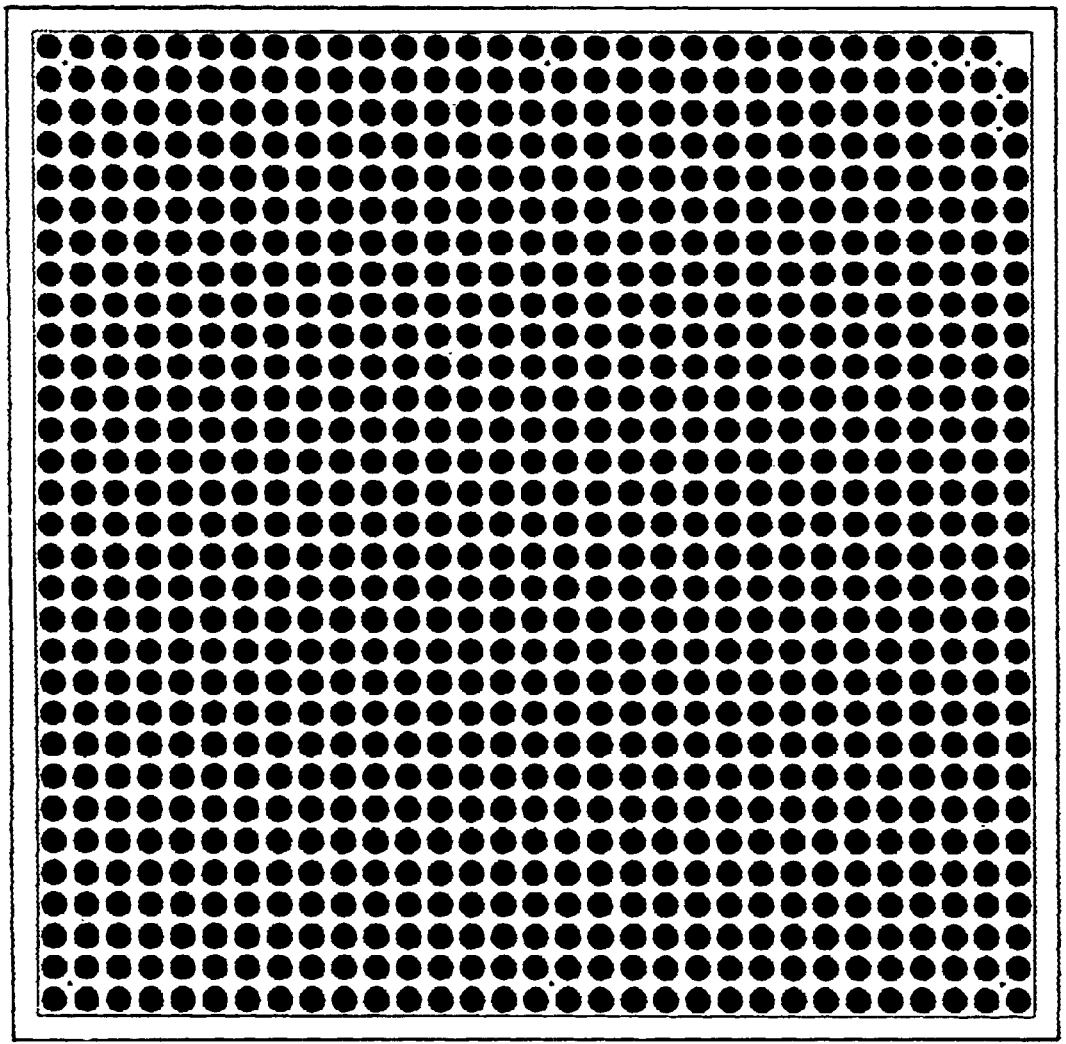
FIG. 17 shows BSM layer L10 formed on the bottom of the tenth dielectric layer.

FIG. 17 shows BSM layer L10 which is formed on the bottom of the tenth dielectric layer D10.

As indicated by layers L4, L5 and L6 of FIGS. 11, 12, and 13, the small center meshes alternate between GND and VD1, so that these two voltage levels couple better to reduce the relative ground and VD1 delta-I switching noise. Also, the GND and VD1 voltage levels are very effectively interconnected vertically by the many systematic vias between adjacent layers of orthogonal sets of GND and VD1 coplanar bus lines. The PVD method has an effective and systematic three-dimensional power and ground distribution system, which is physically and electrically well integrated with the signal net redistribution system.

FIGS. 11, 12, 13, 14 show the similar coplanar design layers L4, L5, L6, and L7. Each coplanar layer is used to redistribute another concentric rectangular ring of chip signal C4's. FIG. 15 shows the second segmented mesh plane layer L8 for VD2, VD3, VD4, VD5, with its small center VD1 mesh. There are also several signal line segments redistributed where possible on this mesh plane layer L8.

FIG. 16 shows layer L9, which redistributes the last ring of chip signal C4's. This last integrated coplanar layer L9 is just above the final layer L10. The final via connections to the BSM signal I/O, power and ground Ball Grid Array (BGA) are made from the coplanar signal, VD1 and GND lines of layer L9, and also from the second segmented mesh plane of layer L8 for VD2, VD3, VD4, and VD5.

FIG. 17 shows the final layer L10, which has the BGA pad metallization for all power and ground pads and signal I/O's.

While this invention has been described in terms of the above specific embodiment(s), those skilled in the art will recognize that the invention can be practiced with modifications within the spirit and scope of the appended claims, i.e. that changes can be made in form and detail, without departing from the spirit and scope of the invention. Accordingly all such changes come within the purview of the present invention and the invention encompasses the subject matter of the claims which follow.

Having thus described the invention, what is claimed as new and desirable to be secured by Letters Patent is as follows:

1. A method for interconnecting ground, signal and power lines in a semiconductor chip carrier comprising:

forming a stack of a plurality of insulating layers with planes therebetween of generally parallel conductor lines including power lines and ground lines formed in each plane, with the planes being formed between the insulating layers with the generally parallel lines being directed in orthogonal directions between any two of the insulating layers, with alternation in successive planes between planes of generally parallel X-directed power lines and ground lines and planes of generally parallel Y-directed power lines and ground lines, forming via connections between planes connecting a power line in one plane to another power line in another plane, forming via connections between planes connecting a pound line in a first plane to another ground line in a second plane, and forming a signal line located between a pair of generally parallel lines selected from ground lines and power lines in a given plane, and forming a signal network (net) with a continuing line segment connected to the signal line, with the continuing line segment being located in another plane between different ground and signal lines.

2. The method of claim 1 wherein the signal line and the continuing line segment are connected by a via passing through at least one insulating layer.

3. The method of claim 1 wherein:

the signal line and the continuing line segment are connected by a via passing through at least one insulating layer, the signal line is between a power line and a ground line, and the continuing line segment is between another power line and another ground line.

4. The method of claim 1 wherein a coplanar group of ground, power and signal lines are formed in parallel in a single plane in a surface of one of the insulating layers.

5. The method of claim 4 wherein the signal line and the continuing line segment are connected by a via passing through at least one insulating layer.

6. The method of claim 4 wherein:

the signal line and the continuing line segment are connected by a via passing through at least one insulating layer and the signal line is between a power line and a ground line and the continuing line segment is between another power line and another ground line.

7. The method of claim 1 wherein a coplanar group of ground, power and signal lines are formed in parallel in a single plane in a surface of one of the insulating layers between a layer of top surface metallurgy (TSM) on top and a layer of bottom surface metallurgy (BSM) on the bottom.

8. The method of claim 1 wherein a coplanar group of ground, power and signal lines are fanned in parallel in a single plane in a surface of one of the insulating layers between a layer of top surface metallurgy (TSM) on top and a layer of bottom surface metallurgy (BSM) on the bottom with via directed along the vertical Z axis interconnecting respective power, ground and signal lines.

9. The method of claim 8 wherein the signal line and the continuing line segment are connected by a via passing through at least one insulating layer.

10. The method of claim 8 wherein:

the signal line and the continuing line segment are connected by a via passing through at least one insulating layer, the signal line is between a power line and a ground line, and the continuing line segment is between another power line and another ground line.

11. Apparatus for interconnecting ground, signal and power lines in a semiconductor chip carrier comprising:

a stack of a plurality of insulating layers with planes therebetween of generally parallel conductor lines including power lines and ground lines formed in each plane, with the planes being fanned between the insulating layers, with the generally parallel lines being directed in orthogonal directions between any two of the insulating layers, with alternation in successive planes between planes of generally parallel X-directed power lines and ground lines and planes of generally parallel Y-directed power lines and ground lines, via connections between planes connecting a power line in one plane to another power line in another plane, via connections between planes connecting a ground line in a first plane to another ground line in a second plane, a signal line located between a pair of generally parallel lines selected from ground lines and power lines in a given plane, and a signal network (net) with a continuing line segment connected to the signal line, with the continuing line segment being located in another plane between different ground and signal lines.

12. The carrier of claim 11 wherein the signal line and the continuing line segment are connected by a via pausing through at least one insulating layer.

13. The carrier of claim 11 wherein:

the signal line and the continuing line segment arc connected by a via passing through at least one insulating layer, the signal line is between a power line and a ground line, and the continuing line segment is between another power line and another round line.

14. The carrier of claim 11 wherein a coplanar group of ground, power and signal lines are formed in parallel in a single plane in a surface of one of the insulating layers.

15. The carrier of claim 14 wherein the signal line and the continuing line segment are connected by a via passing through at least out insulating layer.

16. The carrier of claim 14 wherein the signal line and the continuing line segment are connected by a via passing through at least one insulating layer, the signal line is between a power line and a ground line, and the continuing line segment is between another power line and another ground line.

17. The carrier of claim 11 wherein a coplanar group of ground, power and signal lines are formed in parallel in a mingle plane in a surface of one of the insulating layers between a layer of top surface metallurgy (TSM) on top and a layer of bottom surface metallurgy (BSM) on the bottom.

18. The carrier of claim 11 wherein a coplanar group of ground, power and signal lines are formed in parallel in a single plant in a surface of one of the insulating layers between a layer of top surface metallurgy (TSM) on top and a layer of bottom surface metallurgy (BSM) on the bottom with vias directed along the vertical Z axis interconnecting respective power, ground and signal lines.

19. The carrier of claim 18 wherein:

the signal line and the continuing line segment are connected by a via passing through at least one insulating layer, the signal line is between a power line and a ground line, and the continuing line segment is between another power line and another ground line.

20. A method for interconnecting ground lines and power lines in a dielectric thin and/or thick film semiconductor chip carrier comprising:

forming a stack of a plurality of insulating layers with planes therebetween of generally parallel conductor lines including power lines and ground lines in each plane, with the planes being formed between the insulating layer with the generally parallel lines being directed in orthogonal directions between any two of the insulating layers with each of said parallel power lines being juxtaposed with at least one of said parallel ground lines in each of maid planes, with alternation in successive planes between planes of generally parallel, X-directed power lines juxtaposed with X-directed round lines and planes of generally parallel alternating Y-directed power lines juxtaposed Y-directed ground lines, forming via connections between planes connecting a power line in one plane to another power line in a proximate plane, and forming via connections between planes connecting a ground line in a first plane to another ground line in a proximate plane.

* * * * *